United States Patent [19]

Hively et al.

[11] Patent Number: 5,252,507
[45] Date of Patent: Oct. 12, 1993

[54] VERY HIGH DENSITY WAFER SCALE DEVICE ARCHITECTURE

[75] Inventors: James W. Hively, Sunnyvale; Mammen Thomas, San Jose; Richard L. Bechtel, Sunnyvale, all of Calif.

[73] Assignee: Tactical Fabs, Inc., San Jose, Calif.

[21] Appl. No.: 502,898

[22] Filed: Mar. 30, 1990

[51] Int. Cl.$^5$ .............................. H01L 21/70
[52] U.S. Cl. ........................ 437/51; 437/8; 437/48; 437/52; 437/228
[58] Field of Search ............... 437/8, 47, 48, 52, 51, 437/60, 173, 195, 228, 235, 923, 209; 357/23.6, 40, 41, 45; 324/158 R

[56] References Cited

U.S. PATENT DOCUMENTS

| | | | |
|---|---|---|---|
| 3,795,974 | 3/1974 | Calhoun | 437/923 |
| 4,415,606 | 11/1983 | Cynkar et al. | |
| 4,475,194 | 10/1984 | LaVallee et al. | 371/10 |
| 4,782,465 | 11/1988 | Uchida | 365/72 |
| 4,816,422 | 3/1989 | Yerman et al. | 437/8 |
| 4,833,652 | 5/1989 | Isobe et al. | 365/201 |
| 4,939,694 | 7/1990 | Eaton et al. | 365/200 |
| 4,982,368 | 1/1991 | Arimoto | 365/206 |
| 5,010,019 | 4/1991 | Katoh | 437/8 |

FOREIGN PATENT DOCUMENTS

| | | |
|---|---|---|
| 0338817 | 10/1989 | European Pat. Off. |
| 0051537 | 3/1983 | Japan . |
| 0144956 | 7/1985 | Japan . |
| 0198758 | 9/1986 | Japan . |
| 0275138 | 11/1988 | Japan . |
| 0019739 | 1/1989 | Japan . |
| 2122809 | 1/1984 | United Kingdom . |

OTHER PUBLICATIONS

Ken Warren, "The Evolution of DRAM Technology Towards WSI", 1991 Proc. Int. Conf. on WSI, 1991, pp. 243-247.

Cavill, P. J., "Wafer Scale Integration a Technology Whose Time Has Come", 1991 Int. Conf. on WSI, 1991, pp. 328-330.

James F. Smith, Laser Induced Personalization and Alteration of LSI and VLSI Circuits, Proc. of 1st Laser Processing Conf. Anaheim, Calif., Laser Inst. of America, Nov. 16-17, 1981.

Saigo, "A Triple-Level Wired 24K-Gate CMOS Gate Array", J. Solid State Circuits, Oct. 1985, pp. 1005-1010.

Primary Examiner—Tom Thomas
Attorney, Agent, or Firm—Skjerven, Morrill, MacPherson, Franklin & Friel

[57] ABSTRACT

This invention relates to the design and manufacture of a wafer-size integrated circuit. Lower layers of the wafer sized integrated circuit comprise electrically isolated repeating blocks such as logic elements or blocks of circuit elements. An upper conductive layer comprises data and address bus structures. A discretionary via layer located between the upper layer and the lower layers can be patterned to accomplish multiple purposes. Patterning of the via layer avoids connecting the bus structure to defective elements or blocks, establishes addresses of elements, and establishes the organization of the addressing structure and data structure (for a memory wafer the word length, number of banks of words, and number of words per bank). The via layer is patterned to connect the upper bus lines to selected regions in the lower metal levels after testing (testing uses conventional techniques) for good and bad elements.

11 Claims, 20 Drawing Sheets

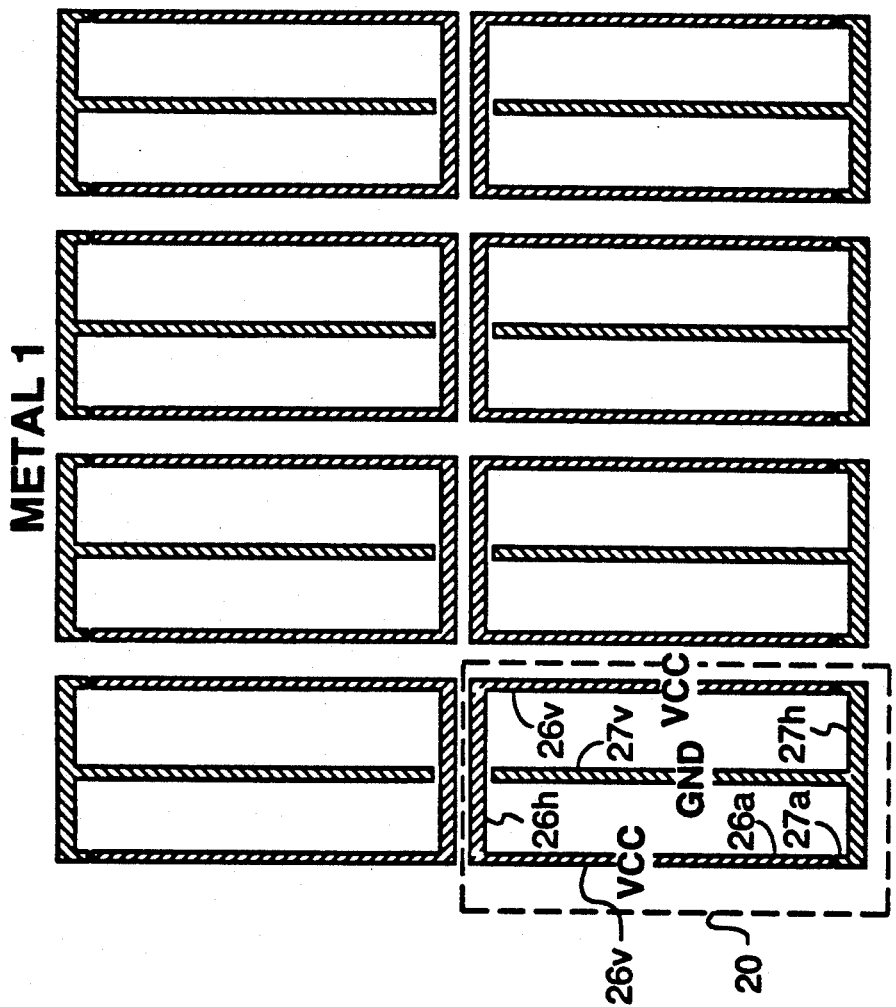

VERY HIGH DENSITY WAFER SCALE DEVICE ARCHITECTURE

FIELD OF THE INVENTION

This invention relates to the design, architecture, control, and manufacture of a wafer-size integrated circuit in which a large number of identical groups of elements are repeated.

BACKGROUND OF THE INVENTION

In the manufacture of semiconductor integrated circuits the yield (the ratio of good chips on a wafer to the total number of chips available on a wafer) is determined, among other things, by the density of defects in the wafer and the ability of the circuit design and manufacturing process to compensate for defects. As the chip size is increased the probability of a defect occurring on the chip increases; hence, the number of defects per unit area limits the physical size of the integrated circuit that can be manufactured without defects.

The problems associated with obtaining defect-free semiconductor chips are magnified many times when a single circuit is to be fabricated on an entire wafer.

To date a wafer sized circuit with zero manufacturing defects has not been achieved. Thus integrated circuit manufacturers are forced to employ special techniques to compensate for defects. In chip sized memories, manufacturers commonly add redundant rows and columns of memory and logic elements which can be substituted for defective elements, with overhead circuitry for use after testing the unit to substitute the redundant memory and logic elements. These redundancy techniques are not acceptable for wafer-size integrated circuits because the added circuitry required to access the redundant memory schemes becomes excessive as the devices become larger.

Another way to overcome defects is through discretionary wiring. Discretionary wiring follows testing of a wafer containing many small, similar semiconductor devices, or clusters of semiconductor devices, which are manufactured using traditional batch processing methods up to but excluding the metal interconnect levels, and identifying the good and bad elements. Only good elements are interconnected by discretionary wiring to complete the structure. Texas Instruments, Inc demonstrated the concept of discretionary wiring in the early 1960s. The Texas Instruments discretionary wiring method is discussed in a paper entitled "Wafer Scale Integration - Historical Perspective" by N.R. Strader and J.S. Kilby, published Sep. 20 and 21, 1984 in "Preprints for The SRC Workshop on Wafer Scale Integration" by Cooperative Research Semiconductor Research Corporation, P.O. Box 12053, Research Triangle Park, N.C., 27709. Texas Instruments created a map of good and bad elements on a wafer. For each wafer, a set of masks for metal and via interconnect patterns were then created to interconnect all the good elements into a single functional integrated circuit. The costs of testing and creating the unique masks made this approach not cost effective.

Many other companies have worked on wafer-size integrated circuits using a multiplicity of approaches to avoid defects in the resulting circuits. Most of the work has been done in the area of logic circuits, but some of the more recent work has been done in the field of integrated circuit memories.

Two recent well known efforts in wafer-size integrated circuit memories have been made by Inova Microelectronics Corp. and Anamartic, Ltd. In the Inova method described in U.S. Pat. No. 4,703,436, conventional single chip static RAMs are completely manufactured up to and including additional interconnect levels which define a bus that connects all chips together through fuses. All chips are tested and the bad chips are disconnected from the bus by blowing the fuses that connect the bad chips to the bus. The bus structure has redundant lines which are electrically connected by blowing fuses in a circuit select decoder. The circuit select decoder, fuses, and test pads all represent overhead circuitry which must be provided in addition to the overhead circuitry present on the individual single chip memories, thereby reducing the overall memory density to less than what is available with conventional single chips. The Inova method addresses the chip enable input pins of the individual chips to be connected by applying additional address bits to the circuit select decoder on one chip of the wafer to extend the range of the addressing available on the individual chips and to reorganize the functionality of the wafer level memory in order to map around defects.

The Inova method does not work with chips having no chip select input. Most Dynamic Random Access Memories (DRAMs) have no chip select input. Therefore, the Inova method will not work with most DRAMs since it has no capability to provide for efficient refreshing of DRAMs. Additionally, the Inova method is limited to a single address port, and inserts detrimental fuse resistance in series with the power supply and ground lines. Further, certain failures in elements initially connected through fuses will produce failure of the remainder of the device before the fuses can be blown. The Inova patent does not address the effect of long metal buses on memory performance, nor does it address manufacturing memory products comprised of whole wafers.

Anamartic, a commercial wafer scale memory company in England, builds whole wafer memory circuits by connecting into long serial looping chains good clusters of DRAM memory cells contained on conventional DRAM chips. The wafer is totally manufactured through all levels. The final wafer level memory software is configured by repetitively accessing the serial chain to test for good and bad memory cells one at a time and substituting good cells for bad cells through the control logic (using software) until a continuously good serial shift register loop is created. The addresses of the good memory bits are stored in an EPROM on a separate chip. When manufactured using DRAM technology, the serial memory organization eliminates conventional methods for refreshing the dynamic memory cells Therefore, the wafer level memory must be continuously clocked to refresh the memory states. This increases the overall power dissipation of the wafer while making the average access time very slow (though still faster than magnetic disk storage devices). The control logic associated with each memory chip increases the support overhead on the wafer by at least 10% and severely limits the memory density per wafer. The off-wafer EEPROM chip prevents the Anamartic technology from providing a fully self supported wafer-level memory. Additionally, the software for addressing only good memory makes the device slow in operation.

DRAM memories must be refreshed (rewritten) periodically (approximately every 16 milliseconds for a 4

Mbit DRAM) and are notorious for high transient switching currents during addressing and refresh. Usually they contain no chip select input and are addressed by presenting a row and column address rather than a single address field for either an entire row or an entire column. For the construction of a conventional wafer-size DRAM memory, high current requirements and space for chip select and other addressing overhead must be accommodated.

A prior art conventional single chip integrated circuit memory is usually composed of a multiplicity of identical smaller memory blocks each of which contains memory cells, decode circuitry to decode an address to access an individual memory cell, sense amplifiers to sense (read) the state of the memory cell addressed, and line buffer drivers to drive local metal interconnect buses. Each single chip integrated circuit memory also contains other circuitry to perform control and timing functions, other required overhead circuitry to support the multiplicity of memory groups, and bond pads which are used to create a physical electrical connection to a package or other off-chip electrical contact. For combining multiple chips into a single memory, these overhead circuits or structures must support and-/or control the group of smaller memory blocks as one common unit. Typically this prior art overhead circuitry may account for 50% of the total wafer area.

SUMMARY OF THE INVENTION

It is desirable to provide a wafer scale device which can be manufactured with high yield, uses low power, has high density, has a high ratio of functional elements to overhead, can be easily tested, loses a small portion of total capacity as a result of a defect, and is economical to manufacture.

In accordance with this invention, an integrated circuit is provided having repeating blocks of circuitry, repeating segments of control logic, and a bus structure. The blocks, segments, and bus structure are tested before being interconnected. After being interconnected, the integrated circuit achieves the above objectives. The present invention applies particularly to a wafer-size integrated circuit which uses multiple identical blocks of addressable circuitry.

In accordance with the invention, multiple identical blocks of circuit elements and multiple identical blocks of control logic are provided on a wafer, both the blocks of circuit elements and the blocks of control logic being small enough that those blocks found defective can be discarded without significantly reducing the capacity of the device, and large enough that testing all blocks requires few current-art test probes. The control logic is preferably located in a center channel extending along a diameter of the wafer and the blocks of circuit elements are located on both sides of this center channel. Connecting the control logic to the circuit elements is a bus structure for which the specific connections allow flexibility in selecting which circuit elements are connected, selecting which control logic elements are connected, and selecting the organization used by the control logic for addressing the circuit elements This bus structure is formed above the layers which make up the circuit elements and control logic, preferably in a single layer.

Discretionary Via

Between the upper bus structure layer and the lower layers making up the circuit elements and control logic elements are one or more via layers (a via layer is an insulation layer in which via openings allow electrical contact between a conductive layer above and a conductive layer below) which are customized for each particular device. Preferably a single via layer is provided. According to the invention, by customizing the via locations in this single via layer, it is possible to accomplish several results: 1) avoid defective blocks of circuitry; 2) avoid defective control logic; 3) avoid defective bus lines; and 4) select the organization of the final structure. The bus structure above the via layer and the element structure below the via layer are organized to allow all three objectives to be accomplished in the single via layer. Performing all customization in a single via layer allows the manufacture of wafer sized integrated circuit devices to become economical in comparison to manufacture of multiple chip-sized devices.

Customization occurs after all active and conductive layers of the integrated circuit necessary to produce fully functional blocks of repeating elements and fully functional control logic segments are manufactured. This typically includes manufacture up to at least a second level of interconnect metal. However, at this point in the manufacturing process, all blocks of circuit elements and center control channel logic blocks up to and including this second metal level are electrically isolated one from another. After manufacture to this point (second metal), each circuit element block and logic block is fully tested, using test probe techniques, and all good and bad blocks are mapped into a computer data base.

According to one method of manufacturing, after testing, the discretionary via layer located between the second metal layer and a third metal layer is patterned to have vias to good blocks only. This via layer provides connections to a bus structure for interconnecting the functional blocks of circuit elements. The via layer connects the control logic (located in the center channel) to all good blocks of functional circuit elements. This insulation layer is the only portion of the entire structure which must be individually tailored in order to avoid electrical connection to defective circuit element blocks or logic blocks, and to connect only all-good blocks into any allowed organization. This patterning may be done using a direct-write E-beam lithography system. Alternatively, patterning can be done by laser exposure, laser drilling, manufacturing a mask dedicated to the individual wafer, or by selectively connecting antifuses. For an 80 Mbyte RAM embodiment to be described, there will be on the order of 500,000 vias to be opened at predefined locations, a number which is not excessive with today's technology and which is less than that required for the equivalent member of circuit elements provided in many individual integrated circuit chips. The locations at which vias are required to be opened are computed from the data acquired through testing, and stored in a computer data file. By leaving predefined via locations unopened, defective blocks can be eliminated from the circuit.

According to the present invention, this step of opening vias located between the bus structure and the circuit element blocks controls not only the connection of good blocks for eliminating defective blocks of circuit elements, but also controls the organization of the final structure, and the number of banks into which the blocks of circuit elements are grouped.

In order to understand the organization discussed here, the functional and physical organization of a memory embodiment of this invention is now briefly described. The large capacity memory (or logic device) is subdivided into several hierarchies of smaller units. First, the memory is divided into banks. Functionally, the banks are divided into words, which are divided into bits. Physically the banks are divided into blocks which are divided into rows and columns of cells. Each cell provides one memory bit. A word is the group of elements (for example memory cells) which is accessed by a single address. Any memory block, regardless of its physical location, can be assigned anywhere within the functional organization of the wafer size memory.

Bus Architecture Flexible With True/Complement Lines

The final metallization (which in the preferred structure is a single third metal layer) includes the bus structural comprising several buses.

The architecture of the bus structure provides for flexibility in the final functional organization of the device, which is determined at the time the via level is customized. The architecture of the bus structure also allows clustered and randomly scattered defects to be accommodated equally easily. The address bus provides sufficient bits to address any set of elements (any word) within the entire device. The device is made up of blocks of identical elements and the bits of a word are stored in multiple blocks, a few bits per block. Some address bits select which element of a block is being addressed, and other address bits select which block is addressed. The address bits which select the element within the block are preferably identically connected to every block in the entire device. The bits which select the blocks are provided on both true and complement lines, different combinations of true and complement lines being connected to an AND gate in each of the different blocks to set a unique address for enabling each block (OR, NOR or NAND gates may alternatively be used to enable the block). This novel arrangement allows the blocks to be given unique addresses at the time the custom via layer is patterned. This arrangement also allows the organization of the blocks (number of banks of blocks) to be established at the time the via layer is patterned. Blocks found defective upon testing will not be connected to the address bus structure when the via layer is patterned.

Multiple Address Buses

A further feature of the invention is the ability to have more than one address bus. In the preferred embodiment discussed below, two address buses are provided. This feature is especially useful for application to memories, and particularly for the automatic refreshing of dynamic random access memories. Counting the data bus, a total of three fixed buses are preferably provided. For a DRAM these are a data bus, a first (read/write) address bus, and a second (refresh) address bus. The data bus and the read/write address bus perform conventional functions, except for the novel feature that the read/write address bus (like the refresh bus) uses lines of two types, bank address and element address, as discussed above. The read/write and refresh address buses both access all blocks in all banks. Since the banks form both functional and physical divisions, it is possible and preferable to address more than one bank at a time. If read/write and refresh addresses provided to the device on the read/write and refresh address buses are to different banks, both addressed elements can be accessed simultaneously, with the result that refreshing of the DRAM has a negligible impact on the rate at which the DRAM can be read from and written to.

Power/Ground Capacitance

As an additional feature of the invention, the structure of blocks of circuit elements includes power and ground lines arranged in a grid of lines which can be interconnected between blocks, and which are physically spaced close together, resulting in high capacitance power and ground supplies having high stability.

Central Control Logic

According to a preferred embodiment of the present invention, control circuitry is centralized for the entire device, such that compared to a plurality of individual chips with individual control logic, there is an overall reduction of overhead control circuitry. The control logic of this invention treats the wafer-size memory much like a single memory chip. In one embodiment for memories, the centralized circuitry controls approximately 7000 memory blocks. Before testing and the subsequent completion of manufacturing, the control circuitry is not yet tied to particular blocks of circuit elements. In particular, the control circuitry is not tied to defective blocks. Thus no additional control circuitry for isolating defective blocks is needed A wafer with higher total density of circuit elements per unit area than density of elements in a plurality of individual chips using the same manufacturing technology (size of circuit elements, line width, and misalignment tolerance, for example) is achieved in the present invention with a combination of the following features providing centralized control logic for controlling the entire wafer, providing small blocks of circuitry which do not include redundant elements within them, and providing minimum control circuitry in blocks of repeating elements.

Avoidance of blocks having defective elements is accomplished by not connecting those blocks found to have defective elements to the control circuitry and to the power supply. The result is that the overhead circuitry is reduced to approximately 25% of the total wafer area as compared to about 50% for conventional single chip DRAMS.

Distributed Memory

As a further feature of the present invention, the bus architecture provides for circuit elements having the same address to be located physically far apart on the device. That is, the bits of a single word are located in different blocks, the blocks being spaced throughout the device. Thus, in applications where circuit elements having the same address are addressed repeatedly and often, the physical layout avoids hot spots (locations on the wafer having elevated temperature) and reduces the incidence of switching current transients in a single location. This prolongs the life of the device and minimizes the effect of noise induced by switching currents.

Testing

According to the invention, the device is tested before manufacturing is complete so that the discretionary via layer can be patterned to avoid defects detected during testing A convenient arrangement of test pads allows a test probe to test every cell in the device using only a small number of test pads. Two embodiments are described. In a first embodiment, test pads are accessed in a conductive layer located beneath the discretionary via layer, and testing is performed before the via layer is applied In a second embodiment the discretionary via layer is applied, and patterned to form test vias only. The bus layer is then applied and patterned. The patterning provides test pads above the test vias and the bus lines. At this point the bus lines are electrically isolated from the test pads and from the blocks of circuit elements and control logic below. In this second embodiment discretionary vias are opened in the via layer (after testing) either by shorting antifuses at potential via locations, or by laser or E-beam melting which results in two metal layers fusing at potential via locations. Opening these vias connects the bus structure to the blocks of circuit elements and control logic below.

If a wafer is found to have a large number of defects, then fewer blocks are available to be connected, and thus the memory will have a smaller total capacity. It is important to note, however, that there is no minimum number of good blocks that can be used. Because a considerable number of excess (redundant) overhead devices (for example: the logic devices for the entire wafer, the contact pads, buffers associated with the contact pads, bus line segments, etc.) are provided, it is unlikely that there will not be a sufficient number of good overhead devices available to control the memory. Thus the memory of the present invention can be manufactured with a very high yield, the size of the memory device being determined during or after manufacture.

The kind of redundancy provided, according to the present invention, allows any distribution of defects and a large number of defects to be accommodated. Because the bus structure is connected after testing, it is simply connected only to good blocks and thus the location of defects is not critical Additionally, if blocks are found to fail after a final burn-in test then a technique is provided to replace them with spare good blocks which have been previously tested and connected to the bus structure.

The architecture described can be used with any memory type, including static RAM (SRAM), electrically programmable ROM (EPROM and EEPROM), or used with a regular matrix logic structure, for example an array processor. Any wafer processing technology can be used to manufacture the base wafer, CMOS, NMOS, bipolar, or other.

BRIEF DESCRIPTION OF THE DRAWINGS

FIG. 5A shows the metal 1 pattern of the power and ground supply lines.

FIG. 11 shows a memory organization which includes spare blocks for substitution after burn-in.

DETAILED DESCRIPTION OF A PREFERRED EMBODIMENT

Figure 1A:
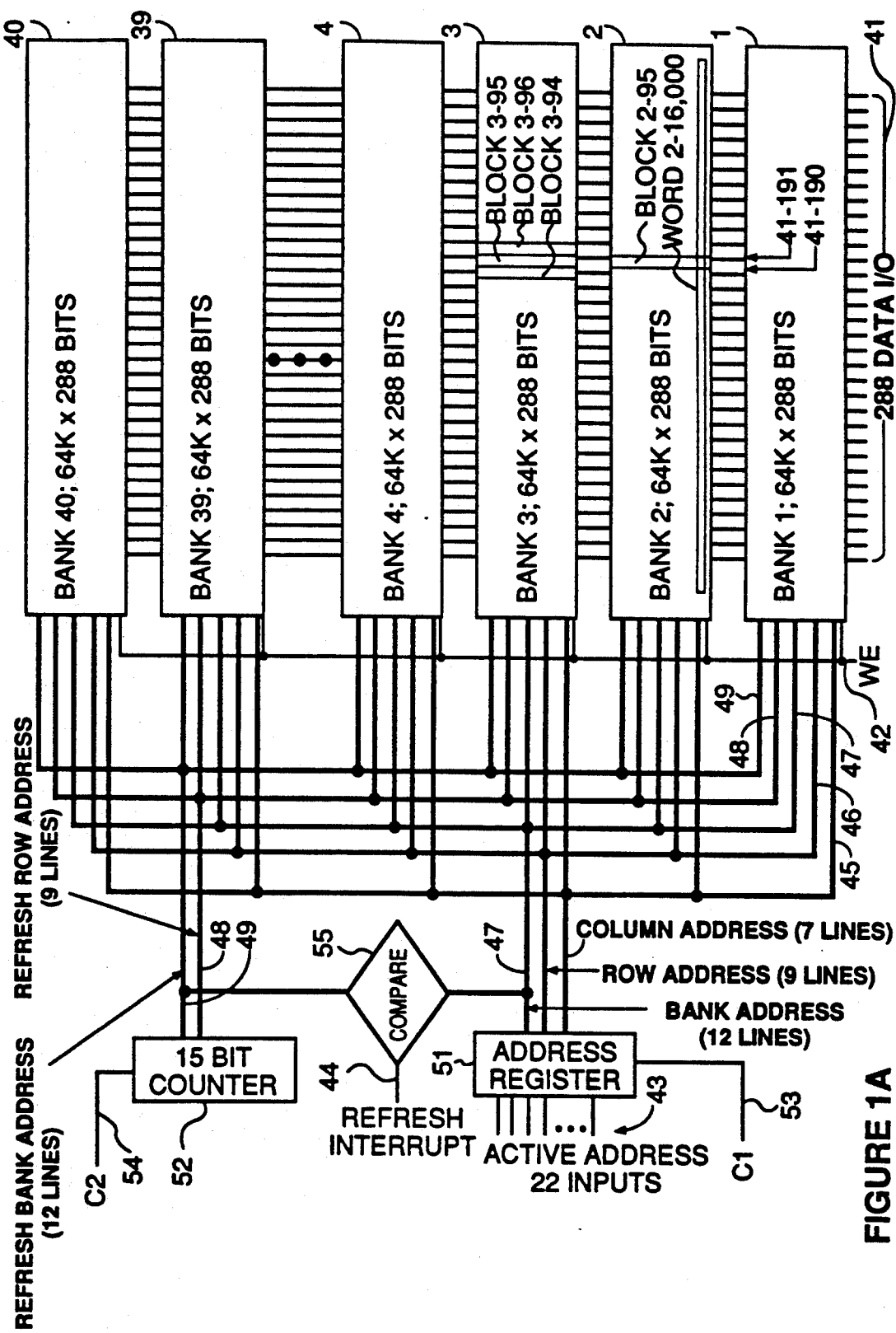
FIG. 1A shows the functional organization of the preferred embodiment.

Described as a preferred embodiment and shown in the figures is a 720 megabit (80 megabyte with 9-bit bytes) DRAM. The structure of the preferred embodiment has an operational speed nearly identical to that of a single 4 megabit DRAM, and power dissipation and current transients less than the total of 9 single 4 megabit DRAMS. This wafer-size memory represents a significant increase in memory density (memory cells per unit area) and power saving over single-chip memories made using the same (in this case, 4 megabit) base technology. The preferred embodiment described contains 80 megabytes (720M bits; actually, 754,974,720 bits) and is made up of small memory blocks. (Note: Herein, the following definitions will be used: Kilo=K=$2^{10}$=1024; Mega=M=$2^{20}$=1,048,576). Each block contains 64K×2 (actually, 65,536×2) bits of DRAM memory plus row and column address decoders, write enable circuitry, sense amplifiers, input/output buffers and additional logic to decode its own unique address from a bank-select address. The memory blocks are functionally grouped together into 40 "banks" of 144 blocks, each bank containing 18,432 K bits (144×64K×2) of the total 737,280 K bits in the memory. Thus there are a total of 5760 blocks. The bits are addressed in "words", each word being 288 bits in length. Thus there are 2.5 megwords in the memory. The functional grouping can be changed by changing the number of banks and the number of blocks in a bank.

Functional Organization/Operation: FIG. 1A shows the functional organization of a preferred embodiment of the invention Recall that the memory is divided into banks. Each bank is functionally divided into words having bits. Each bank is physically divided into blocks of elements. Each element holds a bit. As shown in FIG. 1A, wafer size DRAM 150 consists of 40 banks 1 through 40 of 64K (65,536) words, such as word 2-16,000, each word comprising 288 bits of memory, thus the total memory size is 2.5M words 288 bits long (32 9-bit bytes long), or 80M bytes. Each bank is also divided into blocks. Blocks 2-95 and 3-94 through 3-96 are shown in FIG. 1A. Blocks may be most simply organized such that one bit of a word is in a block. In this case, 288 blocks would make up a bank and each block would include 64K bits However, the addressing overhead is reduced when a block provides more than one bit of a word and thus accesses more than one bit line.

In the presently described embodiment one block accesses two bit lines and provides two bits of a word. Therefore, each bank is divided into 144 blocks, and there are a total of 5760 blocks (144×40). In this embodiment, each block includes 128K bits of memory plus address decode circuitry, two data I/O ports with buffers and a write enable port, as will be discussed in connection with FIG. 1B.

Addressing Structure: The 80 megabyte wafer-size memory 150 is addressed for reading and writing by using a single 22 bit address on port 43. A single 22 bit address provides a unique address for each of the 2.5 megawords (2.5 ×$2^{20}$ words). The 7 least significant bits of the address field provide the block column addresses which are simultaneously available to all 5760 blocks in the memory structure. The 9 next more significant bits of the address field provides the row address for each block and are also simultaneously available to all 5760 blocks in the memory structure. The 6 most significant bits of the address field represents the bank address. These last 6 bits select one of 40 banks to be addressed by enabling the row and column address of each block in the appropriate bank. This 6 bit address is differently applied to the decode circuitry of blocks making up each different bank so that every one of the 144 blocks in one bank responds to the same address. Actually, these 6 most significant bits can be used to define up to 64 ($2^6$) memory banks instead of 40. Indeed, an identical memory can be configured at the time the discretionary via layer is patterned to comprise up to 64 memory banks.

Referring to FIG. 1A, the read/write and refresh address buses of the wafer scale memory are organized as five address buses 45-49 routed to each of the blocks in all 40 memory banks, a total of 5,760 memory blocks. Seven-line read/write column bus 45 takes the 7 least significant bits of the 22 bit read/write active address field applied at 43, and provides the 7 column address inputs 809 (FIG. 1B) for the 5,760 memory blocks. Nine-line read/write row bus 46 takes the 8th through the 16th next most significant bits of the 22 bit active address field applied at 43 and provides the active row address inputs 823 (FIG. 1B) of the memory block for all 5,760 memory blocks. Read/write bank address bus 47 consists of 12 lines and provides the true and complement of the six most significant address bits of the 22 bit read/write address field applied at 43. True or complement of the six most significant bits, taken from these 12 lines of bus 47 are applied to the 144 memory blocks of each memory bank, a different combination of true or complement for blocks in each memory bank, to set the memory bank address for reading and writing, as will be described in connection with FIG. 1B for inputs 825.

Refresh row bus 48 contains 9 lines for providing the row addresses to be generated during refresh. This 9-bit row address is generated on the wafer by a refresh counter. These 9 lines 822 (FIG. 1B) are connected to all 5,760 memory blocks in common. Refresh bank address bus 49 consists of 12 lines containing the true and complement signals of the 6 most significant bits of a refresh counter and corresponding to the bank refresh address. As with bus 47, 6 of these 12 lines on bus 49 are connected to the 144 memory blocks of each memory bank in the same unique combination to decode the memory bank address for refresh, as described in FIG. 1B for inputs 824.

The six true bits of bus 47 are compared to the six true bits of bus 49 by comparator 55, which generates a refresh interrupt signal 44 when it detects an identical address on both buses 47 and 49. This interrupt signal 44 indicates that the same bank has been addressed for both read/write and refresh. In this event, the refresh address has control, and an interrupt signal is sent to the source providing read/write address 43, causing the read/write operation to be delayed until refresh of the addressed bank is complete.

Write enable input port 42 is connected in common to all 5,760 memory blocks. This port selects between read and write operations in the memory depending upon the state (high or low) of the input. The state for reading or writing is dependent upon the detail design of the memory block and is determined by an arbitrary definition at the time of design. Write enable port 42 also controls the direction of data flow through bidirectional I/O buffers 804, 805, 810 and 811 (see FIG. 1B.) in series with the data I/O lines of data bus 41. During a write operation to the memory, the data from data I/O bus 41 is directed to the memory blocks. During a read operation, the data content of the memory block is directed to data I/O bus 41 and to the outputs of the wafer.

Data I/O Bus—Functional Arrangement

The data I/O bus 41 contains 288 data I/O lines. Each block accesses 2 of these 288 data I/O lines 41. For example, block 2-95 of bank 2 accesses data I/O lines 41-190 and 41-191 Block 3-95 in bank 3 also accesses these same two lines but is part of a different bank and is therefore not addressed at the same time as block 2-95. The functional assignment of a memory block within the full wafer size memory 150 is determined by its unique bank address and the data I/O bit position of lines to which it is physically connected.

Operation

During normal operation of wafer scale memory 150, to maintain address stability during the read and/or write cycle, a full 22 bit read/write address is presented and clocked into the address input register 51 in response to clock input 53. The 22 bit address is presented to all 40 banks of memory simultaneously. In response to the six most significant bits of the address, all of the 144 blocks grouped in one of the 40 banks are selected. Bits forming one word in the selected bank are accessed by enabling the row and column addresses indicated by the other 16 bits of the address This causes two memory bits in each of the 144 blocks to be read or written to from data I/O bus 41 depending upon the state of the write enable pin 42. All remaining 5,516 blocks of the memory have their row and column addresses disabled and remain in the standby mode (reduced power), unless selected for refresh.

Automatic Refresh

DRAM 150 is refreshed by addressing rows only. The application of only a row address, in the absence of the column address, causes all bits in the addressed row to be refreshed simultaneously. This method of refresh is preferred for saving time. In the present embodiment, a 64K half-block of memory is grouped into 128 columns of 512 rows. Therefore only 512 unique addresses need to be generated (instead of 64K) to complete a refresh. Each memory cell of a DRAM needs to be refreshed every 16.4 milliseconds. In a conventional DRAM using conventional "steal-a-cycle" refresh cycles, if 200 nanoseconds are required for one refresh cycle (200 nanoseconds per row address) then even when an entire row is refreshed at one time, 4.096 milliseconds ($40 \times 512 \times 200$ nanoseconds) would be required to refresh a 2.5 megaword $\times$ 288 bit memory. This would require that one of every 4 cycles be "stolen" from read/write activity to perform refresh, i.e., the memory would only be available for data transfer 75% of the time. In the present invention the time for providing refresh is made even less significant by implementing as one of its features an automatic background refresh, as will now be described.

Figure 1B:
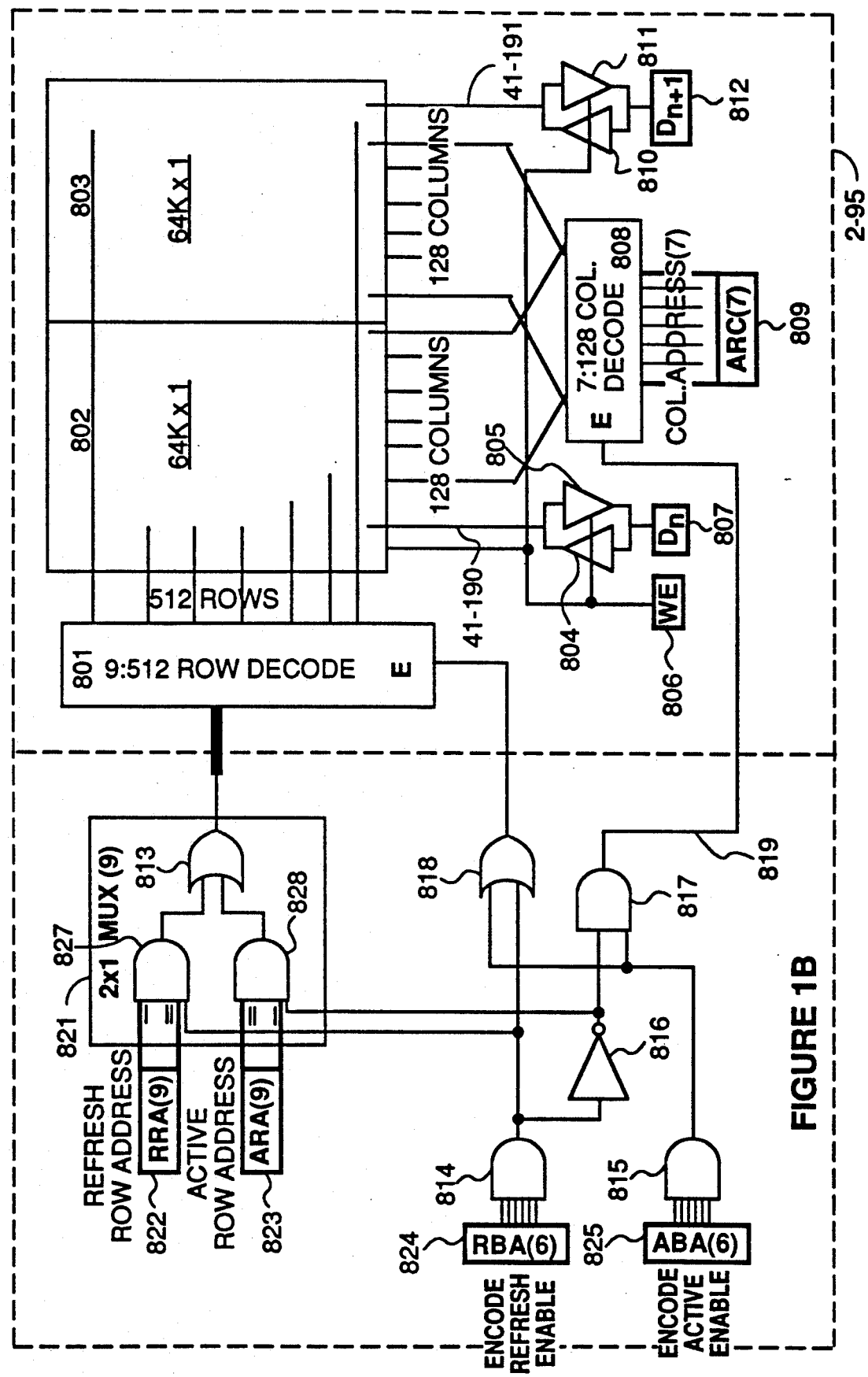
FIG. 1B is a schematic diagram of a memory block.

The preferred embodiment shown in FIG. 1A and FIG. 1B employs an automatic background refresh. A second refresh address is generated on wafer 150 by a simple counter 52 (see FIG. 1A). The outputs of counter 52 drive the refresh buses 48 and 49, providing a 15 bit address field similar to the 15 most significant bits on buses 46 and 47 of the read/write active address field 43. The refresh address provided by counter 52 is presented to all banks of blocks simultaneously Decode logic AND gate 814 (see FIG. 1B) in each block receives either the true or complement of the 6 most significant address bits 824 from bus 49 (bank refresh address, see FIG. 1A) so that 1 of 40 banks (144 blocks of the total 5760 blocks) is selected for refresh. The other 9 bits 822 (see FIG. 1B) of the refresh address are enabled and decoded by row decode 801 as one of 512 ($2^9$) unique addresses to select one row in each of 144 blocks of the bank selected to be refreshed. When a block is selected for refresh, read/write address 53 (all 22 bits) is disabled in all blocks of the selected bank, and the bank selected by the refresh row address from counter 52 is enabled for the refresh cycle. After all 512 row addresses are generated by the counter, one of the six most significant bits of the refresh address will change state and another bank will be selected. No more than 1 of 40 banks is selected for read/write addressing at any given time and no more than 1 of 40 banks is selected for refresh at any given time. To handle the case of the same bank being selected for both refresh and read/write addressing at the same time, the bank address (6 most significant bits) is compared by compare logic 55 to the refresh address. When identity is detected, an interrupt signal is presented to the external interface, signaling the host computer or controller to wait before performing further read/write action until the contending refresh is complete.

The refresh counter 52 counts through all of its states (at least 15 bits) at a speed controlled by C2 clock input 54 sufficient to generate all 32,768 ($2^{15}$) address combinations in no more than 16 milliseconds (the refresh time required for the base technology). This counter may run asynchronously with the active address being presented at 43. Counter 52 generates a new address every 200 nanoseconds (assuming a 200 nanoseconds refresh clock cycle) and begins a new count every 16.4 milliseconds; therefore, a given bank will be addressed for refresh for a period of 0.102 milliseconds (512 rows per block $\times$ 200 nanoseconds per row) every 16.4 milliseconds, or 0.6% of the time. Therefore, the memory can be active 99.4% of the time, as compared with conventional memory which could be active only 75% of the time. This contrast points out the advantage of providing the second port (address bus) for refreshing a DRAM. The numbers will differ for various device implementations or organizations. For example, if the memory is organized into 64 banks of 64K 180 bit words, then refresh would be completed in 6.5 milliseconds, again with only one bank at a time undergoing refresh. In this case, less than 0.063% of the time will an attempt be made to access data in a bank being refreshed.

Further evidence of the advantage of the background refresh methodology of this invention can be illustrated by applying it to an example structure organized as 128 banks of 90 bit words. As such, refresh of the memory would require approximately 12.8 milliseconds. If conventional "steal-a-cycle" refresh methods were to be used the memory would only be available for read and/or write about 22% of the time, but with the background refresh method of this invention, the read write operation would only be interrupted one 128th of the time, and the memory would again be available more than 99% of the time.

Power Reduction: A conventional DRAM addresses a particular memory cell by applying address voltages to the row and column of the cell addressed. Applying the address voltage to a row causes the voltages stored in all capacitors of the row to be applied to sense amplifiers and read back into the respective capacitors even though the content of only one capacitor will be read or written. When rows are selected for read/write or refresh operations, a conventional DRAM dissipates its maximum power, which is usually 50 to 100 times the power dissipated when the memory is in the standby mode and no row is being addressed. In the wafer size memory of the present embodiment, only two of every 40 memory banks will ever be in the high power mode at any one time. That is, one will be in the active mode with active addresses for read/write and another bank will be in the refresh mode. As a consequence of dividing memory into banks and having most banks unaddressed and in the standby mode, the total power dissipation is significantly reduced. The total power dissipation at any given time is the sum of the power dissipated by 38 banks being in the standby mode and 2 banks being in the activated mode. The total power dissipation for the entire 720M bit memory is less than the power dissipated by nine conventional 4 Mbit DRAMs in a conventional memory array.

Memory Block With Second Address Bus: As shown in FIG. 1B, memory block 20 has conventional row and column decoding functions used for addressing conventional memory cells, augmented to incorporate the novel feature of providing dual addressing, which is especially effective for refreshing a DRAM. The embodiment of FIG. 1B uses the second address bus for DRAM refresh and therefore this second address bus includes multiplexed row address lines but not column address lines, because all columns are refreshed simultaneously.

For refreshing a row in memory block 2-95, nine refresh row address lines 822 are provided, individual lines being connected to an input terminal of each one of nine 2-input AND gates 827 (shown as one AND gate but actually comprising nine parallel 2-input AND gates). Applied to the other input terminal of each of the nine gates 827 is a refresh enable signal from the output terminal of 6-input AND gate 814. The six input lines to AND gate 814 are taken from a refresh address bus comprising 12 lines carrying six true and six complement address bits. This address bus runs horizontally in third metal from center channel 101 as will be explained in connection with FIG. 2. Each bank of blocks uses a different combination of true and complement lines, and thus the blocks in different banks are enabled in response to a different address applied to the enable address bus.

Also present in each memory block, as shown in FIG. 1B, are nine read/write row address lines 823. These nine lines individually feed one input terminal of each of nine AND gates 828. The other input terminal of each of the nine AND gates 828 is fed by inverter 816. Inverter 816 provides a high enable signal to AND gates 828 only if a low output from AND gate 814 indicates AND gate 814 is not currently enabling the block for refresh. Thus inverter 816 avoids the conflict which would occur if the block were simultaneously accessed by both the refresh circuit and the device attempting to write to or read from the DRAM, while AND gate 814 and inverter 816 give priority to the refresh function It is conceptually simpler, but not necessary, to have the same combination of six of the 12 true and complement lines connected to AND gates 814 as are connected to AND gates 815.

Multiplexer 821 includes nine 2-input OR gates 813 which provide to the row decode circuitry 801 the address from the enabled set of AND gates 827 or 828 (the disabled set providing logical zeros and not affecting the outputs of OR gates 813). Row decode circuitry 801 is a nine-to-512 decoder which turns on one of 512 ($2^9$) rows in both memory groups 802 and 803 in response to the nine bit address, when enabled by a valid bank address comprised of logically-true signals from the outputs of AND gate 814 or 815 through OR gate 818.

Line 819 from AND gate 817 enables column decoder 808 only when bank 2 (FIG. 1A), of which block 2-95 is a member, is not being refreshed, and when block 2-95 is being addressed with a valid active address for a read or write operation When column decoder 808 is enabled, it decodes the seven-bit column address on 45 address lines 809, turning on one column in each of memory groups 802 and 803. Write enable line 806 selects between the reading and writing function by controlling which of buffers 804, 805, 810 and 811 are turned on. For writing, buffers 804 and 810 are turned on. For reading, buffers 805 and 811 are turned on.

There are also sense amplifiers connected to each of the 128 column (bit) lines in each of memory units 802 and 803. As is well known in the DRAM art, during refresh, when each row line is being addressed, the data in all cells of that row are applied to the corresponding bit line, which is connected to the corresponding sense amplifier, then applied back to the corresponding cell, whereby the cell is refreshed Line 819 disables column decoder 808 during refresh so that the data being refreshed are not placed on lines 807 and 808, and thereby do not conflict with data being placed on data bus lines connected to lines 807 and 808 by other memory cells being read from or written to. A single data I/O line (one of 288 of group 41 shown in FIG. 1A) is physically connected (through a single metal line or multiple metal lines joined to make a single electrical connection) to the data I/O terminal of a single memory group in each of the 40 memory banks. The two memory groups (such as groups 802 and 803 of FIG. 1B) which are connected to the two data bits can be separately tested and used or discarded. The groups are no more closely related to each other than to other memory blocks except that both groups must be assigned to the same memory bank and both use the same address decode circuitry. However, in the preferred embodiment, it is preferred that the memory groups that are connected to a common data I/O line (one group for each of the 40 memory banks) be physically grouped. This grouping has the effect that the 144 memory blocks (288 groups) assigned to a given memory bank will be physically broadly dispersed over the wafer.

Dual Addressing for SRAM: The above description of FIG. 1B refers to dual addressing for DRAM technology, for read/write and refresh operation. Alternatively, the second address bus structure can be used with SRAM technology wherein the first and second address bus structures can address two parts of the memory simultaneously. In the case of SRAM, for which refresh is not required, the second address can be used for reading or writing to two words simultaneously, each being in a different memory bank and having common column or "page" addresses. In this case a second write enable line such as line 806 is required and is added and connected with line 806 using an OR gate. As with DRAM, if both address ports address the same bank simultaneously, one must be given priority and the other must wait. If different banks are addressed, they may be addressed simultaneously. In order to access data at two different addresses on one data bus, the data may be accessed under control of a clock twice as fast as a clock controlling the address functions. In this SRAM case, line 819 does not disable the column decoder 808 but allows data in the two bits that are addressed to be placed on or read from lines 807 and 812, as controlled by timing generated by the control logic.

The functional organization of the memory just described is variable and not directly related to the physical layout of the memory blocks on the wafer. The six bit bank address field allows for as many as 64 banks and the 288 data I/O lines sets the maximum number of bits per word. Other organizations (80 Mbytes or less) also allowed under the preferred embodiment of the inventions are 64 Banks × 64K × 180 bits = 80 Mbytes 56 Banks × 64K × 198 bits = 77 Mbytes 48 Banks × 64K × 234 bits = 78 Mbytes With the simple addition of two more bits to the total address field, along with an additional eight metal lines (described later), the organization flexibility can be extended to 256 banks × 64K × 45 Bits (16 megawords × 45 bits).

Figure 2:
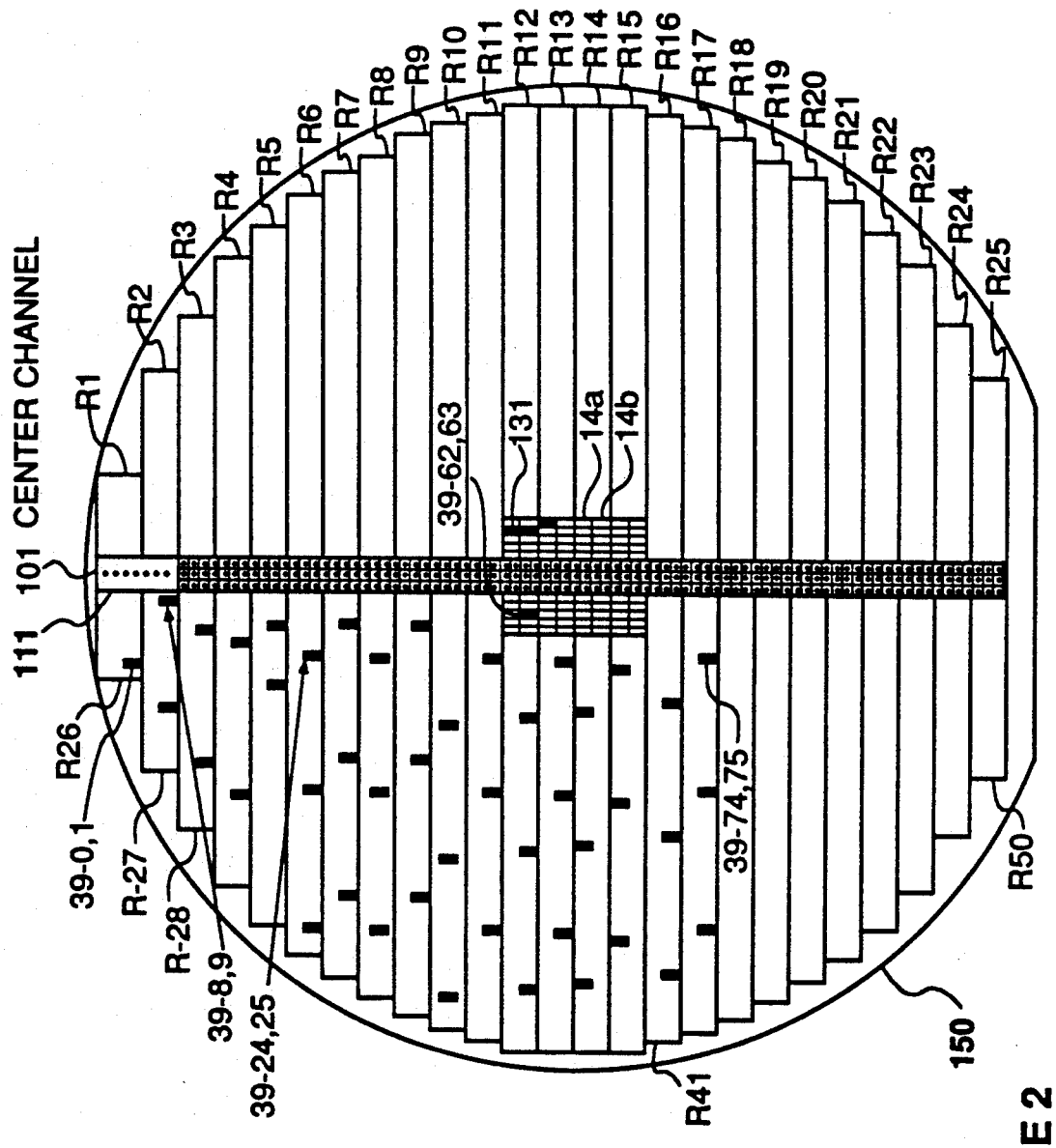
FIG. 2 shows the general physical layout of a wafer of the preferred embodiment.

Physical Organization: FIG. 2 shows the general layout of a wafer 150, including multiple rows R1 through R50 of memory block pairs, extending to either side of a center channel 101 Wafer 150 includes a bus structure extending vertically (in a vertical direction within the plane of the paper) over (above the plane of the paper) center channel 101, and horizontally out over the rows of blocks, for distributing signals throughout the wafer. (In discussion of plan view figures, the words "vertical" and "vertically" will be used to refer to a direction shown as vertical on the drawings and actually located within a layer of horizontally extending material). Each of the memory blocks such as 39-0,1 are identical in their detail design as are each of the center control channel segments such as 111. This ability to entirely compose the wafer using only two design characterizations, one for center channel segments and one for blocks, greatly simplifies the manufacturing of the wafer scale memory of FIG. 2 over other prior art. DRAM technology of the 4Mbit generation requires the use of reduction steppers for the photolithograph processes, since the feature sizes are sub-micron. For the embodiment of FIG. 2, only two reticle sets are required for the manufacture of the base wafer.

Signals from external devices accessing wafer 150 are sent and received from center channel 101. In the case of a DRAM, center channel 101 also includes logic for controlling the refresh function Center channel 101 is divided into segments, such as segment 111. Each center control channel segment includes the following elements: a refresh counter, address latches, groups of inverting and noninverting line buffers, a block of miscellaneous control logic, and several bonding pads for connection to the interconnect structure of the wafer package, as will be discussed in connection with FIGS. 6A, 8A and 8B. Because proper operation of the logic elements and conductive lines in center channel 101 is essential to operation of wafer 150, the elements in center channel 101 are repeated multiple times along the length of center channel 101, thus providing multiple redundant segments. With such redundancy, bad segments can be avoided during patterning of the custom via layer since there is a plentiful supply of good redundant segments to be connected when interconnections are formed.

As discussed earlier, the memory cells are grouped into blocks As shown in FIG. 2 the blocks are arranged in rows extending horizontally to either side of the center channel 101, which extends vertically. Some of the memory blocks are illustrated in FIG. 2 near the center. Block 39-62,63 and block pair 131 are labeled. Memory blocks 39-0,1 through 39-74,75 on the left side of wafer 150 are also labeled and comprise part of bank 39.

All memory blocks in wafer 150 are identical. A block such as block 39-62,63 holds 64K (65,536) bits of memory on each of two sides for a total of 128K bits per block. The blocks are further grouped into pairs, each pair, such as pair 131, holding 256K bits. There are 50 pairs of rows on wafer 150, typical for a 6 inch diameter wafer. As can be seen in FIG. 2, in the case of a circular wafer, not all rows have the same number of blocks. The physical size of the blocks, the number of blocks per row, and the number of rows, varies depending on the dimensional limitations of the base wafer and interconnect technologies.

The blocks are functionally grouped into memory banks, as previously described in connection with FIG. 1A, by discretionary connection to the overlying third metal bus structure, to be described in connection with FIG. 6A. There is no fixed physical relationship between the location of the block on the wafer and the bank to which it is assigned Any block can be assigned to any bank. In one preferred embodiment, one bit of a 288 bit word is stored in one block, and 288 blocks make up a bank. In the presently described embodiment, a word is also 288 bits long and two bits of a word are stored in a block, thus there are 144 blocks in a bank. Blocks 39-0,1 through 39-74,75 form part of one bank, for example. Each block provides access to its two bits by being connected to two lines of a 288 line data bus.

For 80M byte wafer 150, 40 banks may make up the wafer In one organization, the equation for wafer memory capacity is computed as follows:

Given 64K cells per block bit line,
2 bit lines per block,
144 blocks per bank,
40 banks per wafer,
9 bits (cells) per byte.
Then, capacity is:

$$(64K \times 2 \times 144 \times 40)/9 = 80M \text{ bytes per wafer}$$

In yet another organization, a word is 180 bits long and two bits of a word are again stored in one block, resulting in 180 bit lines used in the data bus and 90 blocks comprising a bank. In this case, 64 banks make up an 80M byte wafer. For this case, the equation for wafer capacity is computed as follows:

Given: 64K cells per block bit line,
2 block bit lines per block,
90 blocks per bank,
64 banks per wafer
9 bits (cells) per byte.
Then, capacity is again:

$$(64K \times 2 \times 90 \times 64)/9 = 80M \text{ bytes per wafer}$$

One half of a block may be used and the other discarded if bad Two halves of a block cannot be assigned to two different banks.

Spreading of Power and Transient Currents: According to another feature of the present invention, the bits forming a word of memory (all bits of a word are in one bank) are preferably not physically located adjacent to each other, but are distributed throughout the wafer. This is accomplished by distributing the blocks of a bank around the wafer as shown by blocks 39-0,1 through 39-74, 75 of FIG. 2. All blocks in a bank are simultaneously addressed with the same bank address, and the same cells of these blocks are simultaneously addressed with the less significant bits of the address. The data from blocks which are physically closely grouped are placed on different bit lines of the data bus. The distribution of memory in this fashion distributes the power dissipation, which avoids hot spots, and distributes the transient switching currents about the wafer By making the wafer operating temperatures more nearly constant, and by reducing thermal stresses in the metal lines, this invention thereby increases the life expectancy (reliability) of the wafer.

Figure 3:
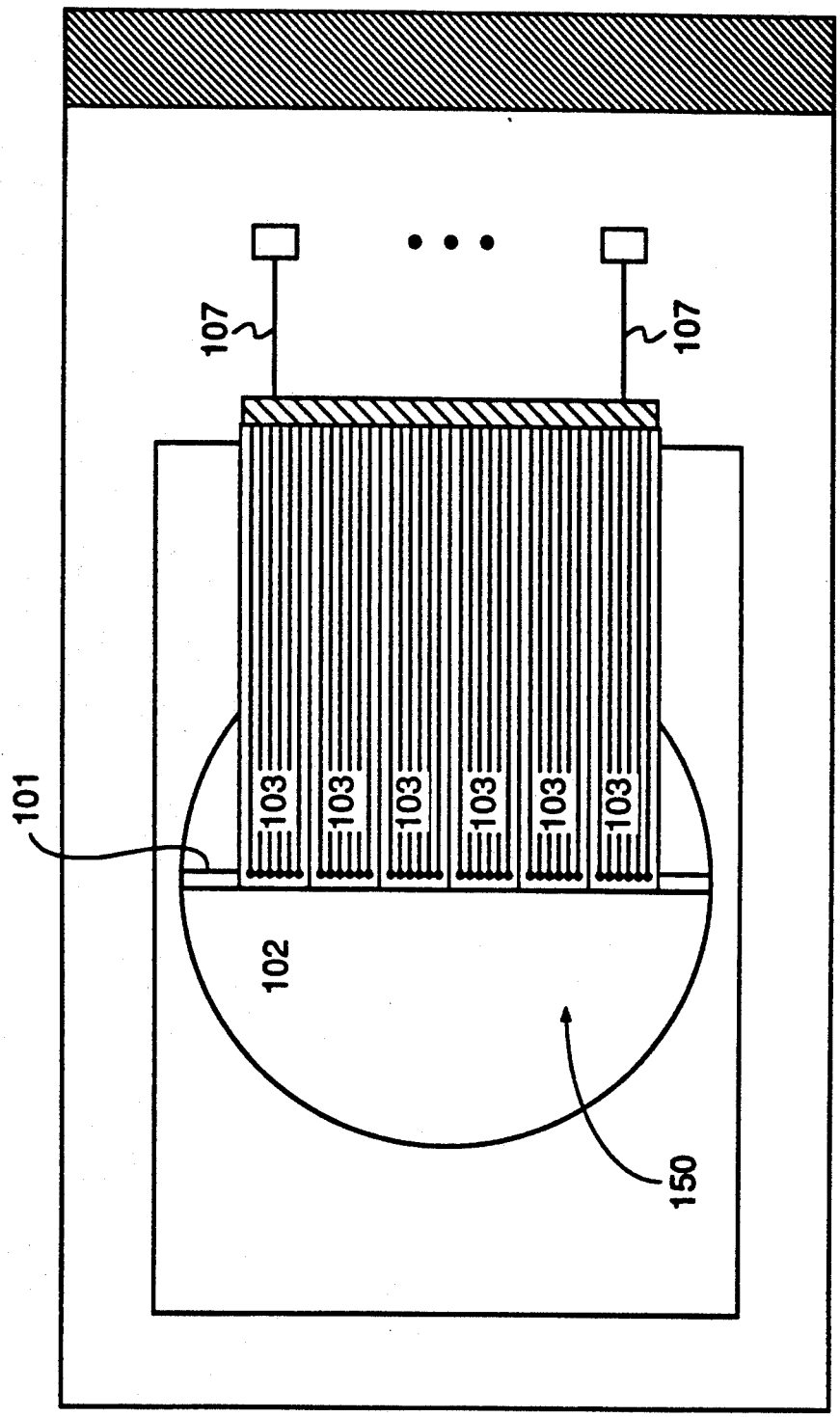
FIG. 3 shows the manner in which signals are brought to and sent from the wafer.

Center Channel Bonding Pads: As shown in FIG. 3, center channel 101 receives and sends signals between wafer 150 and external devices, such as 107, through a plurality of bonding pads 102 to which are attached lines 103 leading off wafer 150. As shown in FIG. 6A and FIG. 8B, these bonding pads 102 each in turn connect through conductive lines to other regions in wafer 150. In the presently described embodiment, memory wafer 150 has 400 ports for connection to the off-wafer package. These ports are:

288 data I/O ports 41, 1 write enable port 42,
22 address ports 43,
1 refresh interrupt output port 44,
1 address clock port (C1),
1 refresh counter clock port (C2),
40 Vcc and 40 ground ports (Vcc and GND not shown).

Six pads are reserved for other potential uses.

In order to increase ruggedness to the attachment process, bonding pads 102 are preferably formed from all three of metal layers metal 1, metal 2 and metal 3.

Bringing lines from devices exterior to wafer 150, as shown in FIG. 3, to the center channel 101 of wafer 150, rather than to peripheral points on wafer 150, balances the distance that an external signal must travel to various parts of wafer 150 from center channel 101. It also reduces, on average, the maximum distance a signal from an exterior device must travel within wafer 150. This reduction of the on-the-wafer distance that a signal has to travel contributes to increased speed because signals travel more slowly within wafer 150 than in lines 103 because silicon has a much higher dielectric constant (11.9) than does the material of which lines 103 are typically composed (3.2). Eliminating bonding pads at the periphery of the wafer has the additional advantage of a simpler manufacturing process, as will be discussed.

Figure 4A:
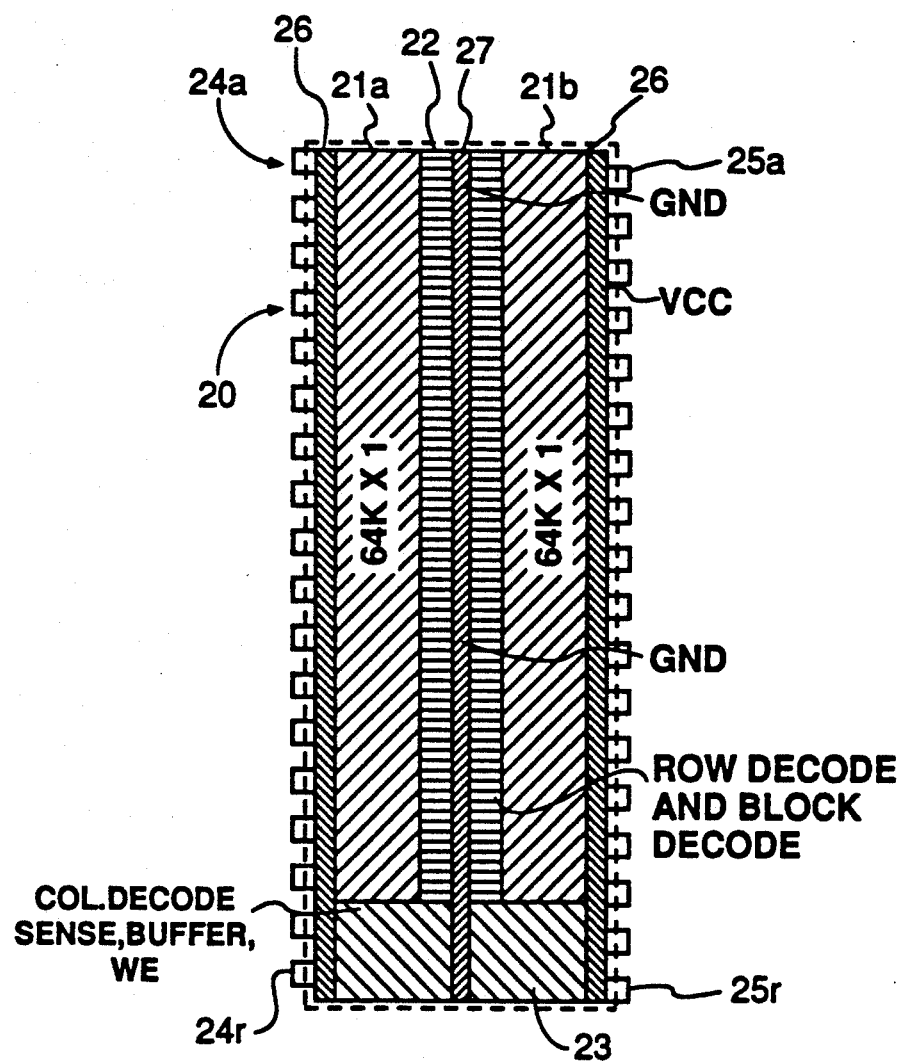
FIG. 4A shows the functional organization of a memory block and its test pads.

Block Structure: FIG. 4A shows a plan view representation of a block 20 of wafer 150. Block 20 includes row decode logic section 22; a column decode, write enable, and sense amplifier section 23; memory cell sections 21a and 21b each having 64K cells; and test pads 24a through 24r and 25a through 25r.

Memory block 20 is implemented in several layers, typically comprising a semiconductive substrate and several conductive layers separated from each other by insulation in which are formed vias through which conductors of one layer contact conductors of another layer. Though many technologies are possible, and the number of conductive layers used may vary, the preferred memory block uses three conductive layers. The first conductive layer above the substrate is typically formed of a metal silicide or polycrystalline silicon, the second conductive layer is formed of metal (1st metal layer), and a third conductive layer, which includes a few jumpers between parts of the block, is also formed of metal (2nd metal layer). Since memory structures using three conductive layers are well known, further detail is not provided.

*Power and Ground Grid Structure:* DRAMs are noted for having associated high transient switching currents. As a consequence there is a critical requirement for capacitance between power (Vcc) and ground (GND) to filter or bypass switching current induced noise. Critical also is the low resistance and inductance of the on-wafer or on-chip Vcc and ground lines as well as the low inductance of the interconnect from the package to the wafer or chip.

This invention minimizes the effects of the heavy transient currents by a means in addition to distributing active memory blocks over the entire wafer, as previously described, namely by providing multiple power and ground bond pads typically (40 each) uniformly distributed along the center control channel. According to the present invention, the structure includes GND and power grids having high mutual capacitance integrated with the memory blocks and interconnected together with the third metal fixed bus structure to provide a stable voltage source to the memory blocks.

Figure 5B:
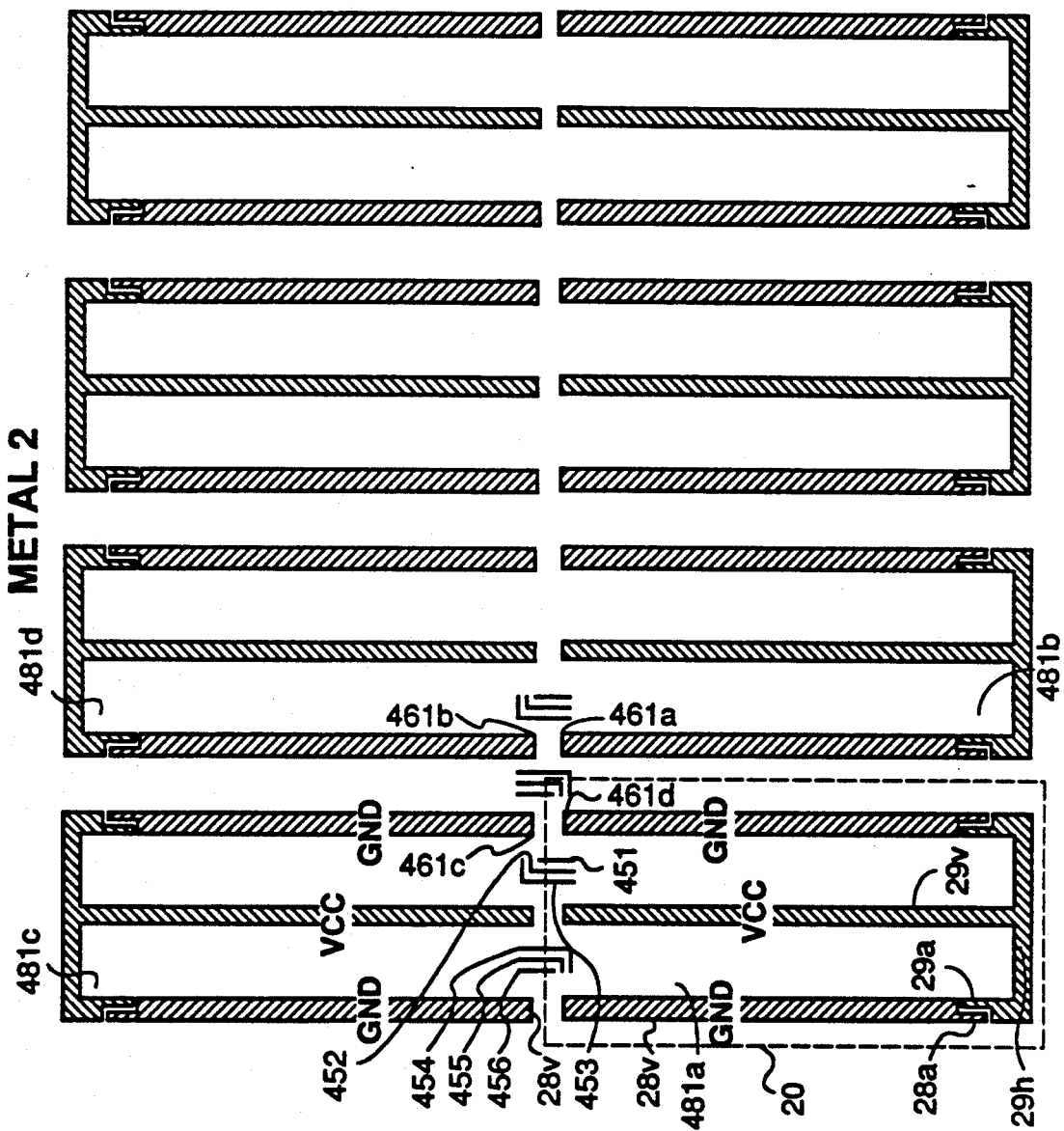
FIG. 5B shows the metal 2 pattern of the power and ground supply lines.

Power and ground lines are formed in two conductive layers and extend along the perimeter and center of each block as shown in FIGS. 5A and 5B. Power and ground lines serving one block are electrically connected to appropriate points within the memory block but elettrically isolated from the bus structure and from other blocks until after testing.

The preferred arrangement of Vcc and ground lines shown in FIGS. 5A through 5D reduces resistance and inductance between the power and ground voltage supplies and other parts of memory wafer 150. The arrangement also maximizes the capacitance between Vcc and ground, which is beneficial in preventing switching current voltage spikes, and thus providing Vcc and GND voltage stability. Vcc and GND lines of unacceptable blocks are not connected to the bus structure in metal 3, thus any short circuits involving Vcc and GND lines of one failed block do not affect other blocks.

The Vcc and GND supplies for memory block 20 have been partly shown in FIG. 4A, with Vcc line 26 shown extending vertically near the left and right edges of block 20 and GND line 27 extending vertically in the middle of block 20. The Vcc and GND lines of FIG. 4A are shown as they are placed in metal 1. The Vcc and GND supply lines 26 and 27 are shown more clearly in FIG. 5A and FIG. 5B, and the remainder of memory block 20 is not shown for clarity. FIG. 5A shows metal 1 as does FIG. 4A. It can be seen in FIG. 5A that in metal 1 over the span of one memory block 20 the Vcc line 26 forms a U-shaped conductor having vertical portions 26v and a horizontal portion 26h extending around most of three sides of the rectangle surrounding the corresponding memory block 20. Vcc line 26 of the memory block does not contact Vcc line 26 of an adjacent memory block. Ground line 27 has a horizontal portion 27h which extends along the fourth side of the rectangle surrounding the corresponding memory block and a vertical portion 27v which extends up the middle of the memory block. Ground line 27 does not contact the Vcc line and does not contact any conductive structures in an adjacent memory block.

FIG. 5B shows the pattern of Vcc and ground in metal 2. Lines shown in FIG. 5B are located directly above lines shown in FIG. 5A. It can be seen by comparing FIG. 5A and FIG. 5B that the vertical portion 28v of the ground line 28 in metal 2 extends to a considerable length in close proximity to the Vcc line 26v of metal 1. Note that there is no horizontal portion of the metal 2 ground line. This interruption avoids conflict with vertically extending data bus contacts 451 through 455, also in metal 2, which are placed to be connectable to the bit lines of metal 3. The vertical portion 29v of Vcc line 29 extends above the vertical portion 27v of the ground line of metal 1. Metal 1 and metal 2 segments of Vcc and ground are connected together at the corners of the block through vias in a separating dielectric between metal 1 and metal 2. Extension 28a of metal 2 ground line 28v lies above and is connected through a via to extension 27a of metal 1 ground line 27h. Extension 29a of metal 2 Vcc line 29h lies above and is connected through a via to end 26a of metal 1 Vcc line 26v.

The large extent of power and ground lines in close physical proximity to each other provides significant capacitance between Vcc and ground, and thus assures a steady voltage supply and reduces noise. The large area of these power and ground lines reduces the inductance and resistance of the Vcc and ground distribution network to further assure a steady voltage supply and reduce noise.

Figure 4B:
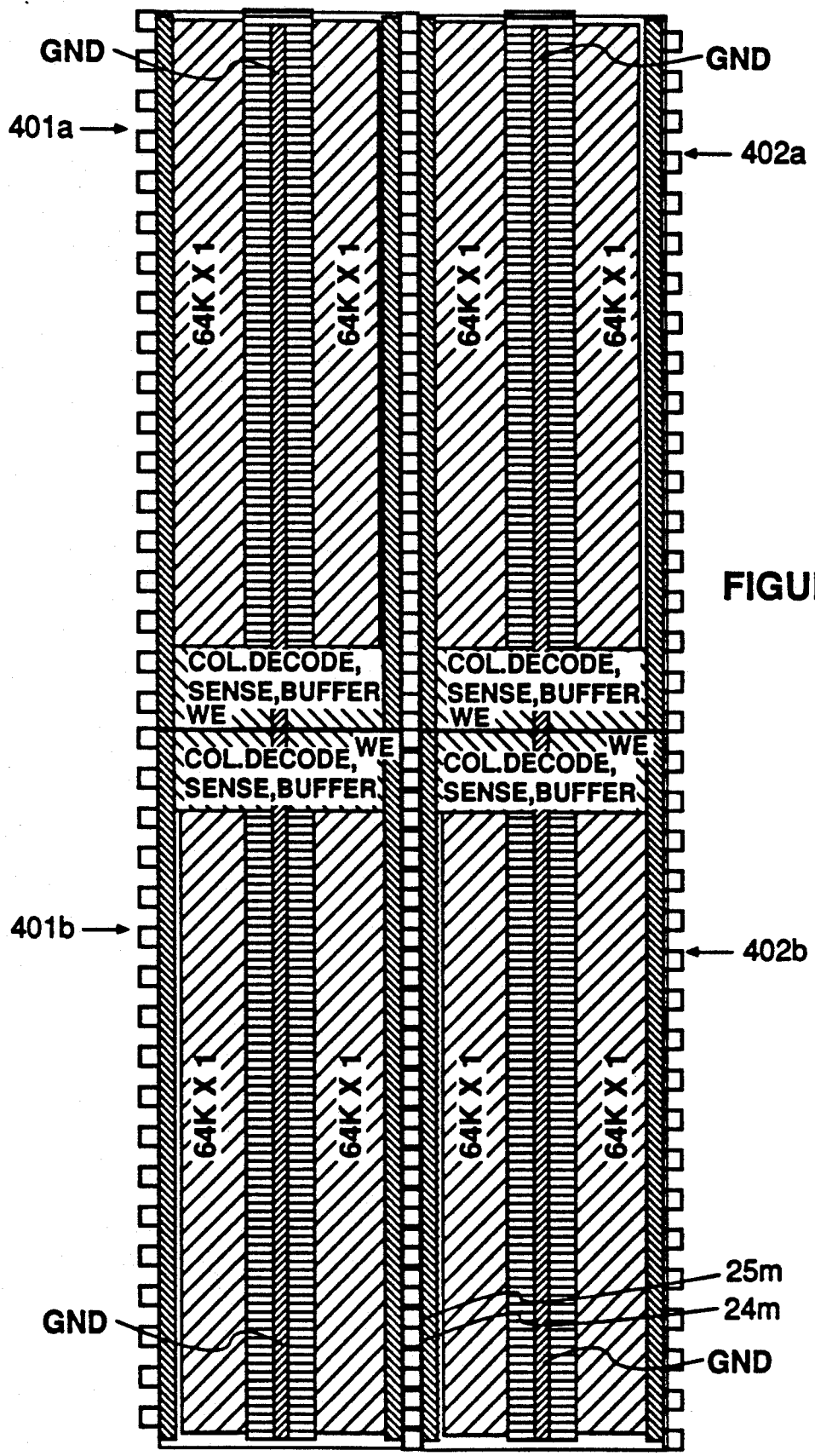
FIG. 4B shows how the memory blocks are organized in pairs and how the test pads interdigitate for test advantages.

Extending upward (in a direction perpendicular to the plane of the drawing), from the first conductive layer through metal 1 to metal 2 between vertical metal 1 Vcc lines 26ν of adjacent blocks, are a plurality of test pad leads, shown in FIG. 4A as leads 24a through 24r and 25a through 25r. The test pad leads of the block shown in FIG. 4A interdigitate with test pad leads of adjacent blocks as shown by leads 24a-r of block 402b and leads 25a-r of block 401b in FIG. 4B. In FIG. 4B four blocks are shown. One block-pair consists of blocks 401a and 401b, and the other block-pair consists of blocks 402a and 402b. This interdigitation of test pads provides for a pad pitch (center-to-center distance) that allows for testing using conventional test probe spacing technology while using only half the usual test pad area per block.

Figure 5C:
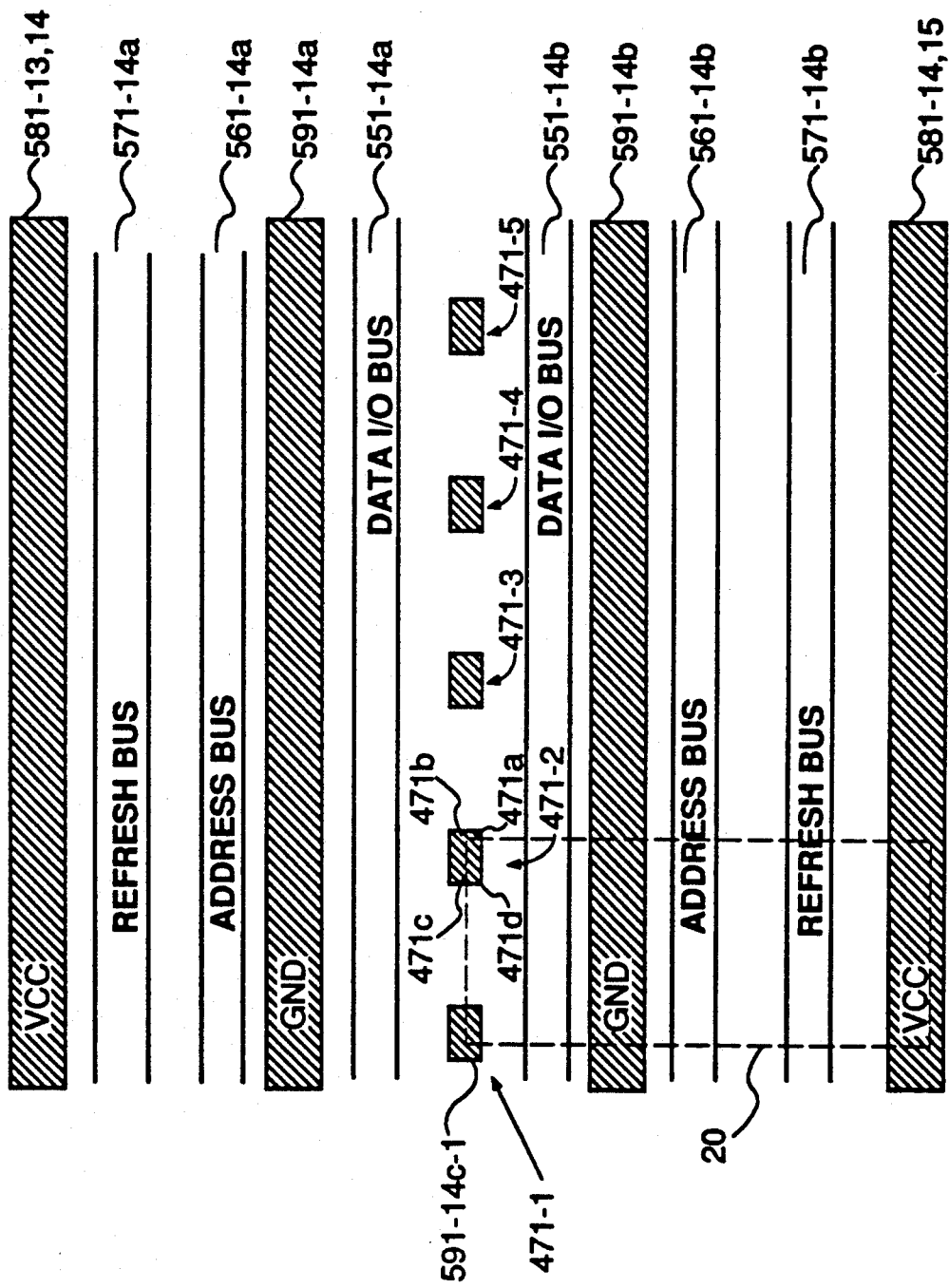
FIG. 5C shows the metal 3 power and ground lines, connector pads and data I/O and address buses.

FIG. 5C shows the layout of a portion of metal 3 extending above the blocks shown in FIGS. 5A and 5B. Address bus horizontal lines 561-14a and 561-14b are indicated as are refresh bus lines 571-14a and 571-14b. Data I/O bus lines 551-14a and 551-14b are also shown. Also shown are metal 3 Vcc lines 581-13,14 and 581-14,15 and metal 3 ground lines 591-14a and 591-14b. Suffixes 13, 14, 15, 14a and 14b in the above reference numbers refer to the row pairs shown in FIG. 2. Row pair 14 of FIG. 2 is illustrated by way of example in FIG. 5C. The structure shown in FIGS. 5A-5C applies to all row pairs.

Figure 5D:
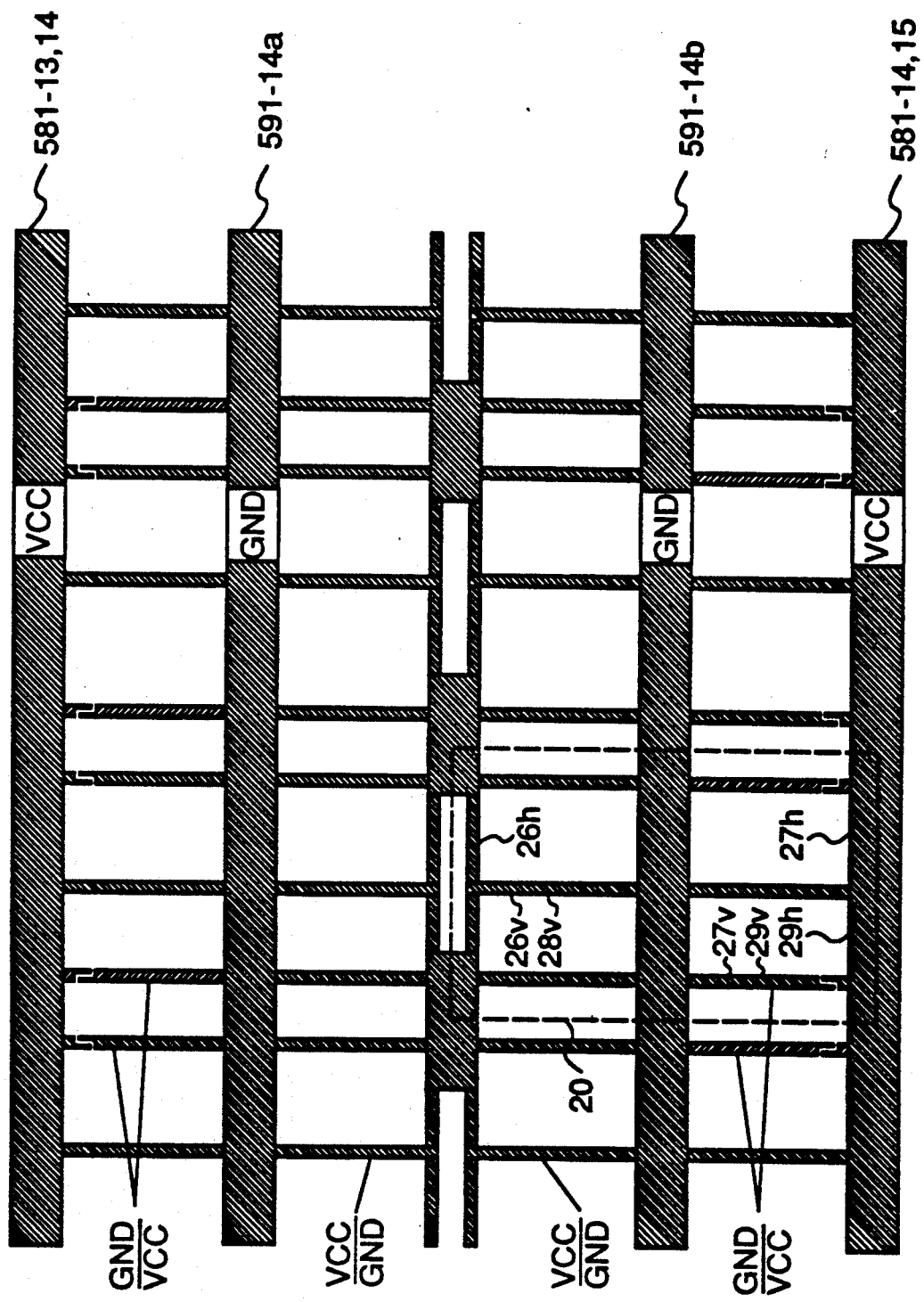
FIG. 5D shows the composite power and ground bus structure showing the respective positioning in metal 1, 2 and 3.

As shown in FIG. 5C, located in metal 3 along with the address and data bus structure and the power and ground lines are connector pads such as pads 471-1 through 471-5 positioned above the corners of four adjacent memory blocks. By opening vias beneath corners 471-a, 471-b, 471-c and 471-d of connector pad 471-2, this pad can be made to interconnect ground lines of four memory blocks at corners 461a, 461b, 461c, and 461d in metal 2 shown in FIG. 5B, if upon testing, all four of memory blocks 481a, 481b, 481c, and 481d are found acceptable. As can be seen in FIG. 5C, also present in metal 3 along with the data bus lines and two kinds of address bus lines are large Vcc lines 581-13,14 and 581-14,15 and ground lines 591-14a and 591-14b extending horizontally above the blocks. Numbering of these power and ground lines is the same as the numbering in FIG. 6A. The suffixes 13, 14 and 15 refer to row pairs R13, R14 and R15 in FIG. 2. For blocks found acceptable, these metal 3 power and ground lines are connected to the respective metal 2 vertically extending power and ground lines (shown in FIG. 5B) by opening vias in the discretionary via layer between metal 2 and metal 3. The eventual interconnection of power and ground lines (after testing) creates two contiguous grid structures over the memory portion of the wafer surface FIG. 5D illustrates the composite locations of the power (Vcc) and ground lines in metal layers 1, 2 and 3, given in FIGS. 5A, FIG. 5B and FIG. 5C.

*COMB-LIKE STRUCTURE OF BUSES:* In the preferred emobidment of the present invention, there are three signal buses, predominately located in the 3rd metal layer. These are one data bus 551, one read/write address but 561, and one refresh bus 571. As partially shown in FIG. 6A, these bus structures each have a comb shape. The handle portion of the comb extends vertically to one side of the row of contact pads 102 located in the center of center channel 101. The teeth of the comb extend horizontally across the blocks of memory cells from the handle.

Figure 6A:
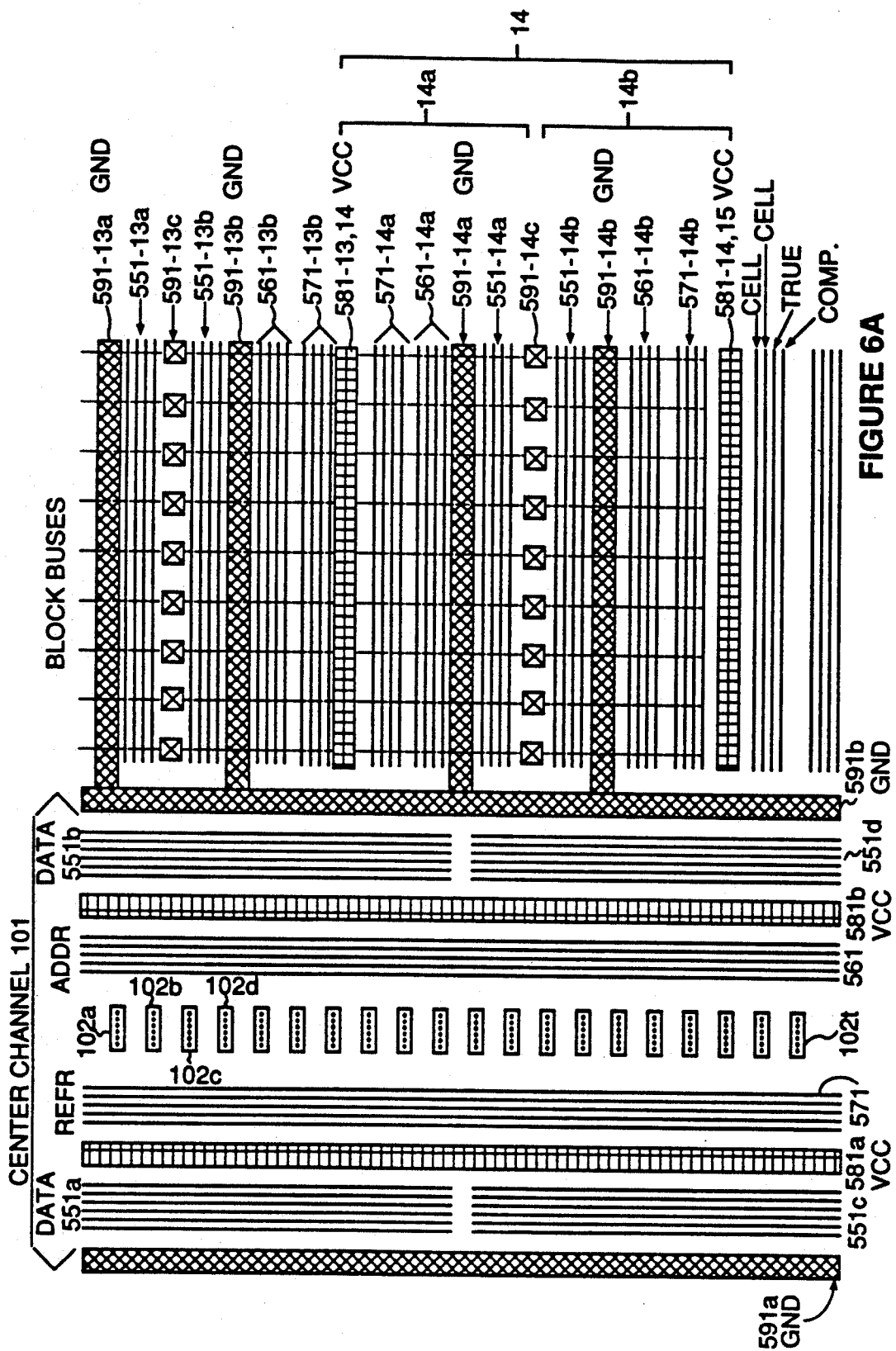
FIG. 6A shows a representation of the metal 3 buses extending above the blocks and center channel.

FIG. 6A shows a representation of the bus structures of a preferred embodiment of the invention. For a memory organization using 288 bit words there will be somewhat more than 288 lines in the data bus, additional lines being available in the event some lines prove to be defective, or available in order to accommodate clustered defects.

Herein the case in which 300 data bus lines are provided will be discussed. The entire 300 line data bus 551 extends vertically in portions of center channel 101, each line of date bus 551 being connected to a corresponding bonding pad such as 102a, 102b, etc., in center channel 101 for accessing signals off the wafer. As shown in FIG. 6A, in order to save space, these 300 data bus lines are arranged in four groups 551a, 551b, 551c, and 551d in four quadrants of center channel 101. There are 75 lines in each group, only a few in each quadrant being shown in FIG. 6A. Also, as another feature of the invention, in order to save space, not all data bus line segments extend horizontally above all blocks, only those needed to access particular bits of a word stored in the row. Line segments 551-14a and 551-14b extend above memory block pair row 14 and line segments 551-13a and 551-13b extend above memory block pair row 13. Other rows are similarly arranged.

As shown in FIG. 6A, the horizontal bus line segments such as 551-13a and 551-14b preferably do not connect directly to corresponding segments of vertical bus 551b or 551d. Indeed they preferably remain disconnected until after testing of the blocks and ine segments, so that unacceptable blocks and line segments can be avoided. Located in the substrate beneath center channel 101 are buffers such as 807, 808, 809 (see FIG. 8A, also FIG. 1B) to which horizontal and vertical se9ments of the data bus 551 are attached after testin9 to form a continuous data bus structure 551. The selection of which horizontal line segments are to be connected to which vertical line segments can be performed after testing.

The structure of the address buses includes a vertical portion composed of two sets of lines, 561 and 571, running in center channel 101 and horizontal portions extending above all memory blocks. The two sets of vertical lines 561 and 571 may each comprise both a read/write address bus and a refresh bus. Alternatively, one set of lines may comprise a read/write address bus and the other a refresh bus. This second alternative is described here, bus 561 being the read/write address bus and bus 571 being the refresh bus. In the case of address buses, there is no division of address lines into quadrants or segments, because all address bus lines extend above all blocks in the entire wafer. Buffers may be provided between horizontal and vertical sections, however. By connecting these buffers after testing, it is possible to compensate for defects in a horizontal segment of an address bus by not connecting a row in which an address bus horizontal segment is defective. The provision of all address bus lines over all blocks is less cumbersome than would be the provision of all data bus lines over all block pairs. For the presently described emodiment, only 49 address bus lines (28 read/write and 21 refresh) are needed whereas 288 data lines would be needed.

Figure 7:
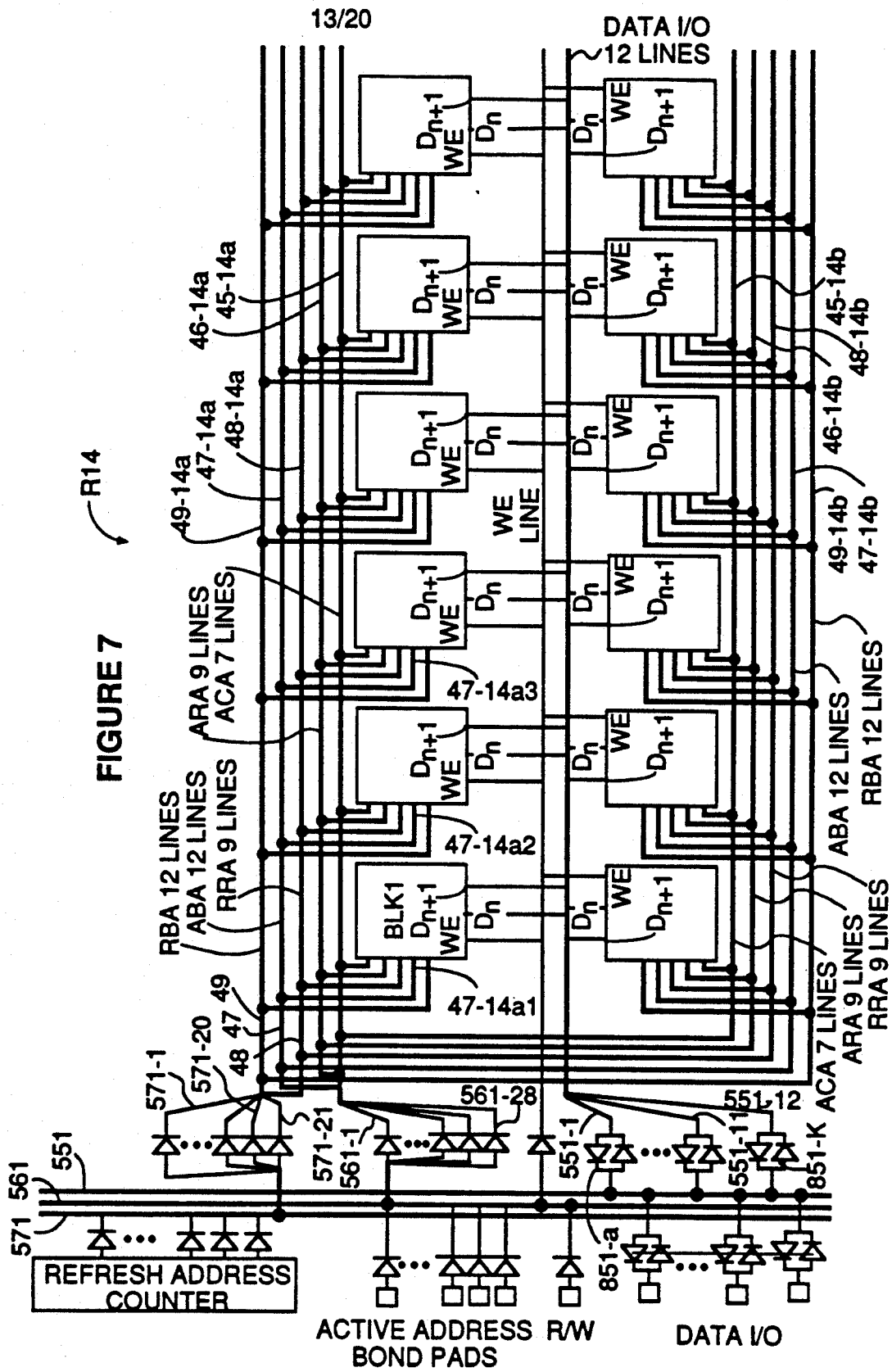
FIG. 7 shows a schematic of the address and data buses that feed a block-pair row from the center channel.

The horizontal address and data bus structures are shown in schematic form in FIG. 7. In the case of data bus 551, the 12 horizontal data bus line segments 551-1 through 551-12 extending over a row of block pairs such as block pair row R14, of which six block pairs are illustrated in FIG. 7, may be interconnected through buffers such as 851a through 851k to a choice of vertical lines which form the comb-handle of data bus 551, thereby allowing the determination of which rows of blocks will be attached to which data bus lines to occur after testing. In contrast to the data bus structure, each address bus line of vertically extending portions of read/write and refresh address buses 561 and 571 is connected, either directly or through a buffer, to corresponding horizontal address bus lines extending over all blocks. As shown in FIG. 7, read/write address bus 561 divides into three bus portions, also called buses. Six lines of 28-line bus 561 are buffered, each line connecting through both an inverting and a non-inverting buffer to 12-line read/write bank address bus 47, which divides into segments 47-14a and 47-14b which extend above blocks in rows 14a and 14b respectively, some of which are shown in FIG. 7. As explained earlier, in connection with FIG. 1A and FIG. 1B, bus 47 provides the true/complement bank address to all blocks. Only one of the two true and complement lines representing one address bit in bus 47 driven by bus 561 is connected through the discretionary via layer to a block. Thus only six lines 47-14a1 extend from bus segment 47-14a to block 1, and if block 2 is in a different bank from block 1, a different combination of six of the 12 lines extend from bus segment 47-14a to block 2. Bus 561 also drives buses 45 and 46, all lines of which are identically connected to all blocks to provide read/write row and column addresses.

The 15-line refresh bus 571 includes 6 lines which drive 12 lines of bus 49 through inverting and non-inverting buffers, as explained above in connection with bus 47. Six of these 12 lines are connected to each block as explained in connection with bus 47. Refresh bus 571 includes 9 row address lines buffered to 9 row address lines of bus 48, which are identically connected to every block.

If blocks 1 and 2 are assigned different bank addresses by connecting different combinations of six lines from bus 47, it is acceptable to connect line D0 of blocks 1 and 2 to the same one of data bus lines 551-1 through 551-12. However, if blocks 1 and 2 are assigned the same bank address, then data line D0 of block 1 must be connected to a different one of data bus lines 551-1 through 551-12 than data line D0 of block 2 is connected to.

Vertical Vcc line 581b in center channel 101 (see FIG. 6A, also FIG. 5C) is electrically connected through conductive layers beneath the metal 3 layer to horizontal lines 581-13,14 and 581-14,15 which extend along the upper and lower borders of memory block pair row 14 (see FIG. 2). Thus, memory block pair row 14 can be visualized to be ocated between Vcc lines 581-13,14 and 581-14,15. In each block pair row there are two rows of memory blocks. Memory block pair row 14 comprises an upper row 14a and a lower row 14b (see FIG. 2). These two rows are served by a common data bus including line sets 551-14a and 551-14b (FIG. 6A), each line being connectable through a buffer such as 851a through 851k (FIG. 7) located in the active substrate and through a connective means in the discretionary via layer beneath metal 3 to one of lines 551d in center channel 101. Ground lines 591-14a and 591-14b are connected to center channel ground line 581b.

Horizontally extending read/write address and refresh address lines are individually connected to each read/write and refresh line of vertical read/write and refresh buses 561 and 571 in center channel 101. As shown in FIG. 6A, extending above block row 14a are two sets of address bus lines: 28-line read/write address bus 561-14a and 21-line refresh address bus 571-14a. Each of the 28 read/write address lines 561-14a is connected directly or indirectly to a corresponding line of center channel read/write address bus 561, which is in turn connected to one of bonding pads 102 Each of the 21 refresh address lines 571-14a is connected directly or indirectly to a corresponding line in center channel refresh address bus 571, which is in turn connected (after testing) to a digit output line of a counter, such as counter 1013 (FIG. 8A), in center channel 101.

Contact pads 591-14c are located at the adjacent corners of blocks in a block pair (see also FIG. 5A) and serve to interconnect ground lines of adjacent good blocks after testing, as will be discussed.

There may be buffers located between a vertically extending line of the address buses 561 and 571 and each corresponding horizontal line extending above each row of blocks. Alternatively, one address line buffer may serve one horizontal address line in each of several rows.

*Read/Write Address Bus:* The read/write address bus 561 includes lines with two different functions: cell address lines which address particular cells within a block (typically thought of as the lower order address bits), and bank address lines which address particular banks of blocks (typically thought of as the higher order address bits). All blocks which will be used in the final memory are identically connected after testing to all cell address lines.

Included in address bus lines 561-13b, for example, which extend above row 13b of block-pair row 13, are both cell address lines and bank address lines. In one embodiment shown in FIG. 1B there are 16 cell address lines (7 column and 9 row) and 12 bank address lines (6 true and 6 complement). For simplicity, these are represented in FIG. 6A as two cell address lines and in connection with block pair row 15 they are labeled "cell", and one pair of bank address lines is labeled "true" and "comp". The numbering of horizontal lines in the block bus portion of FIG. 6A includes three digits which correspond to numbering of bus lines in center channel 101. Following the hyphen are two digits plus a letter which refer to the row pair and row of the row pair above which the lines extend. For example, address lines 561-14a are lines extending above memory block pair row 14 and above the upper row (row a) of the pair.

The combination of true and complement bank address lines to which the block is connected after testing depends upon the bank to which that block is assigned.

*Refresh Bus:* In the case of a DRAM, there is an additional refresh address bus 511. This bus is driven by one of several counters, such as counter 1013 (FIG. 8A), which are provided in center channel 101. The structure of refresh bus 571 is similar to that of read/write address bus 561, and includes cell address lines and 12 bank address lines Refresh bus 571 is different from the read/write address bus 561 in that the 9 cell address lines include row but not column address lines because all columns in a row of a block are refreshed simultaneously.

Figure 6B:
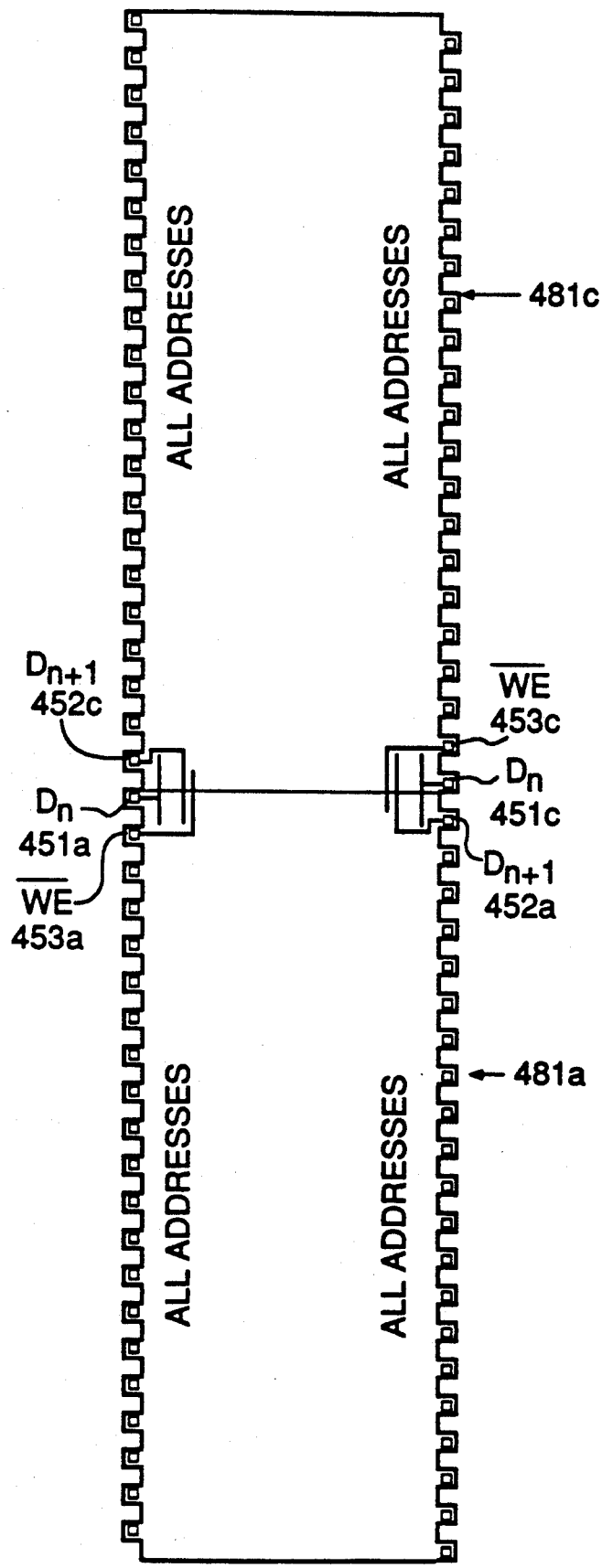
FIG. 6B shows the orientation of a memory block-pair and how the data bus contacts are arranged so that data bus lines can be shared between blocks of the pair.

*Shared Data Bus Lines:* As shown in FIG. 6B, the blocks are preferably arranged in pairs, one member of the pair oriented as rotated 180° around an axis perpendicular to the plane of the drawing from the other member of the pair. Bit lines extend vertically (in the plane of the drawing) in the metal 2 layer from one block across the boundary of the adjacent block of the pair but do not connect electrically. Memory block 481c includes write enable line 453c, data line 451c, and data line 452c, which extend into the region of block 481a. Block 481a includes write enable line 453a, bit line 451a, and bit line 452a, which extend into the region of block 481c. These lines are electrically isolated from each other and the lines from block 481a are electrically isolated from any part of block 481c into which they extend, leaving blocks 481a and 481c electrically isolated from each other before testing. The geometry shown in FIG. 6B, in which all of vertically extending lines 451a, 452c, 453a, 451c, 452a, and 453c share a horizontal band above which data lines of metal 3 extend, provides that any of these lines may be connected to any of the metal 3 data lines extending horizontally above them. This pairing allows for the sharing of the data I/0 and write enable bus. The block pairs are replicated in a regular matrix over the entire surface of the wafer except for a small band of approximately 3 mm width around the circumference of the wafer This regular matrix consequently forms repeating rows of block pairs, the rows being of different lengths in a round silicon wafer.

Figure 8A:
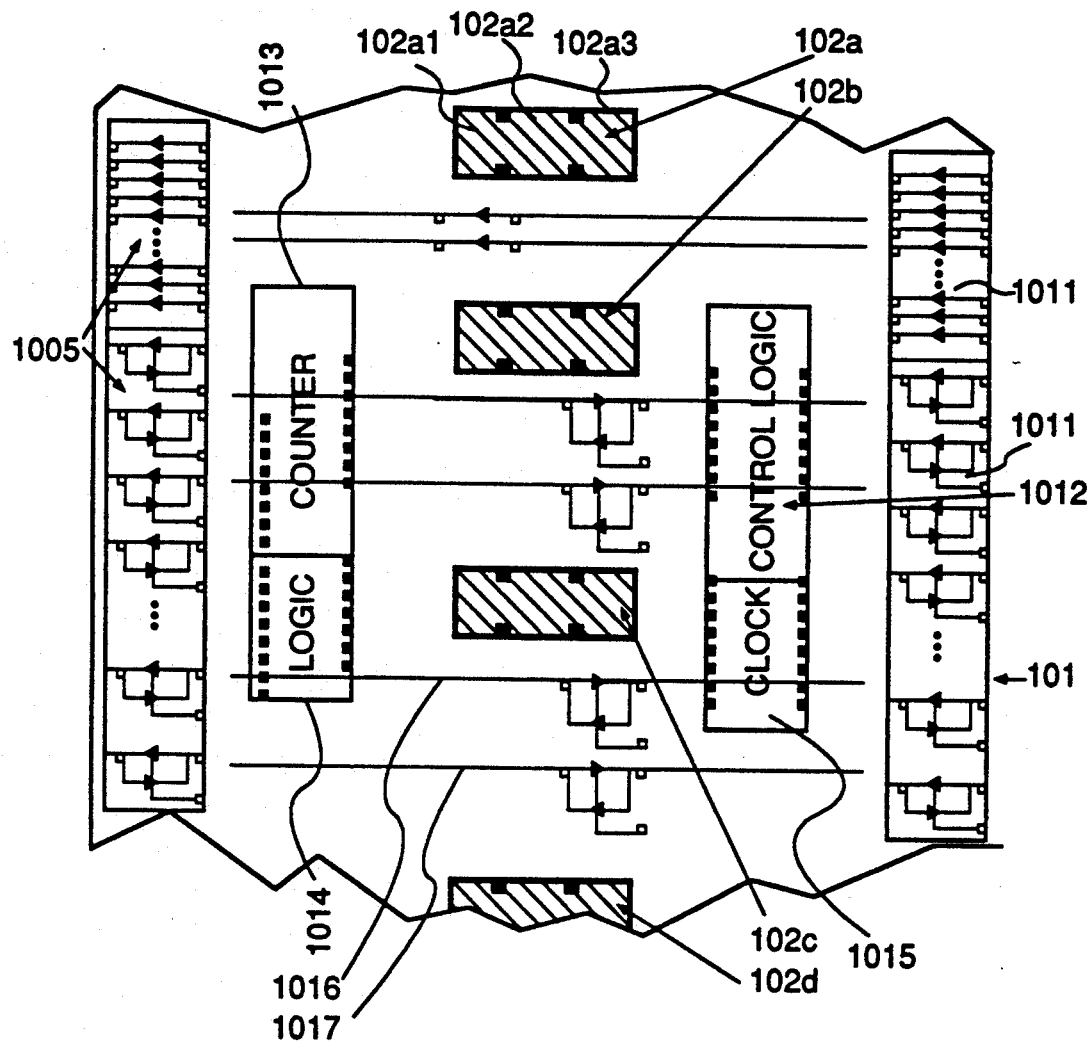
FIG. 8A shows a physical layout of a portion of a center channel segment
Figure 8B:
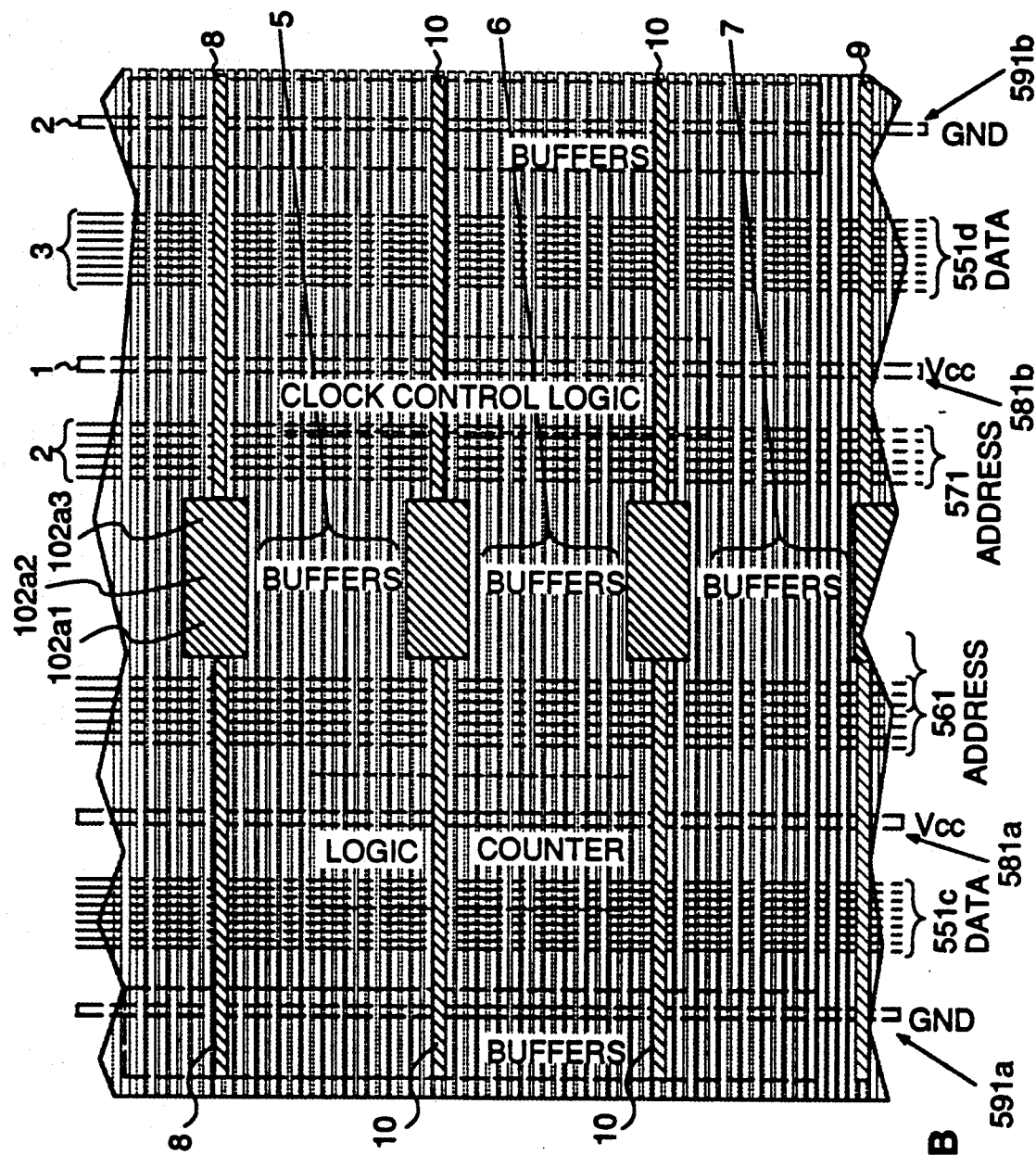
FIG. 8B shows the metal 2 and metal 3 bus structure for the portion of a center channel segment shown in FIG. 8A.

*Center Channel Segments:* Center channel 101 is arranged in segments, of which segment 111 is labeled in FIG. 2 The segments are preferably identical FIG. 8A and FIG. 8B show a portion of a segment of center channel 101. Segments such as shown in FIG. 8A and FIG. 8B repeat throughout center channel 101, providing many more clocks, counters, logic functions, and buffers than needed. Thus, if some of these are found defective, the wafer can still be connected after testing to use only good clocks, counters, logic functions and buffers. There may be five to twenty-five center channel segments. Each segment provides a clock, a counter, other logic functions, buffers, and contact pads. Only one clock and one counter are needed for refreshing a wafer scale DRAM, thus there is multiple redundancy for these functions. However, the space for providing an excess of these essential functions is small. A few hundred buffers may be needed and twice the number may be provided to assure an adequate number, again at a small cost in space. The present embodiment provides 400 bonding pads when 394 will be used. This smaller degree of redundancy in bonding pads allows for some defects, as will be discussed in the section on blocks that fail at burn-in, and yet minimizes the excess additional space needed for the large contact pads.

The 400 bonding pads of which pads 102a, 102b, 102c, and 102d are shown in FIG. 6A and FIG. 8A are preferably vertically aligned with adjacent pads such that if the 400 exterior lines (103 of FIG. 3) to be attached to the 400 pads are held in a common medium, the 400 lines can be simultaneously brought into position against the 400 pads and attached. The bonding pads are preferably shaped with multiple redundant portions such as 102a1, 102a2, and 102a3 in FIG. 8A to have sufficient size that an external line can be attached to one portion of the pad, then removed and another set of external lines attached to different portions of the pads in the event the first portions were damaged in the process of removal.

In metal 3, as shown in FIG. 6A, address, data, power and ground buses extend vertically across the center of the wafer approximately the full diameter of the wafer (stopping a few millimeters before reaching the perimeter, thus avoiding an area where defects are common and might cause failure of the wafer). Though it is not necessary that segments of center channel 101 (such as segment 111 shown in FIG. 2) be of a height which is a multiple of the height of a row pair such as row pair 131 of FIG. 2, it is preferable to maintain this synchronous arrangement. Then when the manufacturing process uses a stepper (a photolithographic tool), the same step distance used to form the memory blocks, can also be used to form the center channel. This requires changing only the reticle, and possibly shuttering the image size, and does not require also having to change the stepping distance.

In the substrate, in the silicide or polycrysalline silicon layer, and in metal 1, as illustrated in FIG. 8A, each segment of center channel 101 includes control logic devices 1012, logic devices 1014, counters 1013, and clocks 1015 for controlling the DRAM refresh function. Center channel 101 also includes multiple buffers 1005 and 1011 which can be interconnected, after being tested and found acceptable, between the data bus lines running vertically in the center channel 101 and the data bus fingers extending horizontally above the memory blocks. Buffers 1005 and 1011, located near the perimeter of center channel 101, are usable to connect the vertical portions of the data bus 551, shown in FIG. 6A as quadrants 551a, 551b, 551c, and 551d to the horizontal portions of the data bus such as 551-13 and 551-14. Since buffers 1005 and 1011 are not connected until after testing, it is possible to select which bits of a word will be stored in which rows of blocks by controlling which of the complete set of lines in the vertical data bus will be connected to particular horizontal data bus lines and thence to individual blocks.

As shown in FIG. 8B, in metal 2, horizontal lines extend both left and right from each of the bonding pads, pads 102a1 through 102a3 being shown in FIG. 8B. Between the bonding pads additional lines extend horizontally, some being connected to an input or output lead of a buffer. These horizontal conductive lines in the center channel portion of metal 2 can be selectively connected to desired vertical lines of metal 3, thereby determining the interconnection of portions of the center channel to the bus lines after testing. Since about 80 of the 400 pads in this embodiment of the invention are used for power and ground lines, it is possible to establish which of the pads will be used for power and ground after manufacture of the device (but before interconnection). However, if the technology being used will require considerable current in the power and ground lines, it may be preferable to designate which of the bonding pads will serve for power and ground, and form extra wide lines extending horizontally from these bonding pads so that these lines extending from the power and ground pads can carry sufficient current without early failure.

*Distributed Memory Avoidance Of Hot Spots:* In a preferred embodiment, the memory is organized so that the bits of a word are distributed about the wafer. All bits of a word are stored in the same memory bank, but each bit or few bits of a word are stored in a different block of memory. Within a bank, one block stores only bit 0 and bit 1 of 64K different words. Another block stores only bit 2 and bit 3 of the same 64K words. Yet another block stores bit 4 and bit 5, and so on, 144 blocks within the bank thus storing all bits of 64K words, each word having 288 bits. The blocks of a bank are preferably not adjacent, but distributed about the wafer, as shown by the location of blocks 141-0,1 through 141-74,75 in FIG. 2, in order to greatly reduce the effects of hot spots on the substrate. The remaining bits of a word are similarly distributed in blocks of the same bank located throughout the remaining memory. A hot spot can occur if the same region of memory is repeatedly addressed. Since some computer programs will repeatedly address certain regions of memory, with the present invention the heat generated by addressing this section of memory can be spread over the wafer by physically separating the digits of the same word. Even though heat is generated by those addressed blocks more than by adjacent addressed blocks, the very small amount of heat generated by addressing a block will be dissipated by adjacent blocks as well as by the structure to which the wafer is mounted, thus maintaining the addressed cell in a cooler state than if adjacent blocks had also been addressed, and maintaining a series of smaller temprature gradients over the wafer as a whole rather than one very large gradient.

*Reduced Number Of Data Bus Fingers:* A further benefit of this distributed memory organization is achieved by grouping all blocks which store bit 0 and bit 1 in the same row, or a few rows; all blocks which store bit 2 and bit 3 in the same row or few rows; etc. In one 80 megabyte RAM wafer, as shown in FIG. 2, the longest row of block pairs includes about 160 block side pairs, 80 block pairs in a row on either side of center channel 101. The blocks holding a particular bit position are arranged adjacently; for example, block pairs holding bit 0, bit 1, bit 2 and bit 3 start in the upper left corner and occupy the left side of rows 1 and 2; block pairs holding bit 4, bit 5, bit 6, and bit 7 being assigned to the remainder of the left side of row 2 and part of row 3; and so on. Any blocks found defective upon testing would be skipped in the assignment. This way, even the longest row pair, row 13 for example, will hold data for only about 8 significant digits of the 288 bit words. Therefore only 12 (8 data lines plus a few spares) rather than 288 lines, will need to extend across even the longest row pair to connect the cells in blocks of that row pair to corresponding data lines in the 288 line data bus running in center channel 101, and provide redundant data lines for flexibility in the case a line is defective. In order to provide redundant lines in case of defective lines, one embodiment provides 12 lines above a row pair in a long row and 8 lines above the short row pairs at the top and bottom of the wafer.

*Mask Formation Using Two Reticles Per Layer:* As was stated earlier, eliminating bonding pads at the periphery of the wafer has the additional advantage of a more simple manufacturing process. In a preferred embodiment of the present invention it is possible to generate a photolithographic mask for the entire wafer using only two stepper reticles for each layer of the structure one for forming memory blocks and one for forming center channel segments. This use of only two reticles per layer compares favorably with a wafer in which contact pads are located along the perimeter of the wafer. One such prior art wafer required 17 reticles per layer in order to achieve a controlled relationship between the memory cells and the contact pads.

According to the above described embodiment of the present invention in which two memory blocks of a pair can be connected to any of a plurality of data bus leads located above or near the line joining the two blocks in the pair, one reticle per layer can be formed to generate the pattern of all memory blocks and the other reticle can be formed to generate the pattern of all segments of the center channel. As shown in FIG. 6B, a memory block, for example memory block 481c, includes leads (for example, leads 451c, 452c, and 453c) extending beyond the rectangular outline of memory block 481c and into the rectangular outline of memory block 481a. Memory block 481a can be formed from the same set of reticles as memory block 481c by rotating the reticles 180° on the vertical axis. Leads 451a, 452a and 453a of memory block 481a then extend into the rectangular outline of memory block 481c. When making the detailed design of the memory block, it is of course necessary to assure that the leads which extend beyond the boundary do not make contact with leads of the adjacent, but rotated, memory block. A reticle is formed to generate a block pair so that these leads do not extend beyond a reticle boundary. The leads 451a through 453c extending a short vertical distance to either side of the boundary between a block pair are located in metal 2 and are available to connect to any of the data bus lines which extend horizontally above these vertical leads. The third metal busing structure is made from a single mask, of full wafer size, which is applied to the wafer all at one time and is not stepped.

*Testing and Redundancy:* As discussed earlier, a memory on the order of 80 megabytes must have some means for providing redundancy in order for the manufacturing process to yield a significant quantity of acceptable devices. The memory of the invention is organized into blocks for which no redundancy is provided. Redundancy is provided by manufacturing more blocks, more lines, and more overhead circuitry than will be needed in the finished memory, then testing the blocks, lines, and overhead circuitry before interconnecting these separate units to form a single integrated circuit memory.

The testing is performed under computer control, using an algorithm which tests every cell in a block and indicates a failure if any cell fails to meet the requirements of the several test vectors which have been used. The computer keeps a list of locations of blocks which have passed the test. Center channel buffers, logic units, clocks and counters are also tested.

Figure 9A:
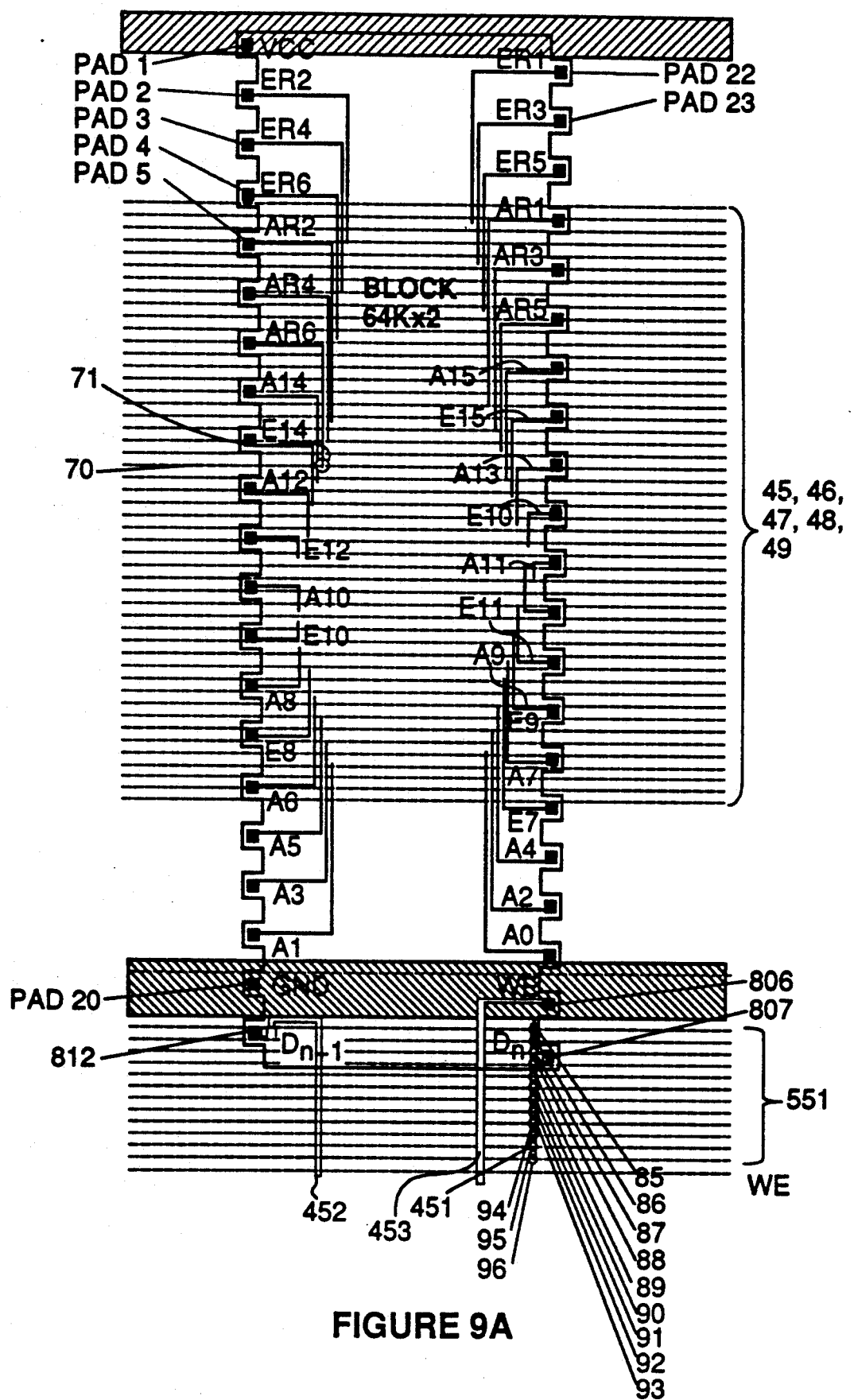
FIGS. 9A and 9B show the manner by which the signal lines of the blocks can be selectively connected to the signal buses

It is possible to perform this testing before the third metal layer and the insulation between second and third metal are formed. If this is to be done, as shown in FIG. 9A, test pads such as ER1-ER6, AR1-AR6, E1-E15, and A1-A15 are provided in metal 2 for testing each of the circuit elements and other devices in a block. Bus lines 49 located in metal 3 are shown as dotted lines in FIG. 9A. Bus lines such as line 50 will be connected through vias such as via 51 to the same metal line as was used to lead from a test pad such as test pad A14 to points in the block, if the block was found acceptable.

As another benefit of the present invention, only a small number or test pads per block, 42 in the embodiment of FIG. 9A, are needed to test all 128K circuit elements in a block. Lines from these test pads are connected in a well known manner to points within the corresponding block for applying test voltages and reading generated voltages. These 42 test pads allow generation of the row and column address of every circuit element in the block, the refresh address of every row, and measure whether proper voltages are received from every circuit element in the block. In the DRAM memory embodiment discussed here, both blocks in a memory block pair can be tested by simply using a conventional probe card having 84 test probes. As a further advantage, with the interdigitated test pads of adjacent memory blocks, best seen in FIG. 4B, the center-to-center pad pitch is sufficiently large to be able to use conventional test probes, while the area per block required for test pads is only half what would be required if test pads were not interdigitated.

*Possible Manufacturing Variations:* The base wafer as manufactured up through the second layer of metal (prior to test) as described in the above embodiment uses four Mbit DRAM manufacturing technology which has sub-micron features and very small metal pitches on the order of three to four microns on the second layer of metal. The third layer of metal in which the bus structure is formed, has relatively loose design tolerances with approximately a 20 micron pitch.

Figure 9B:
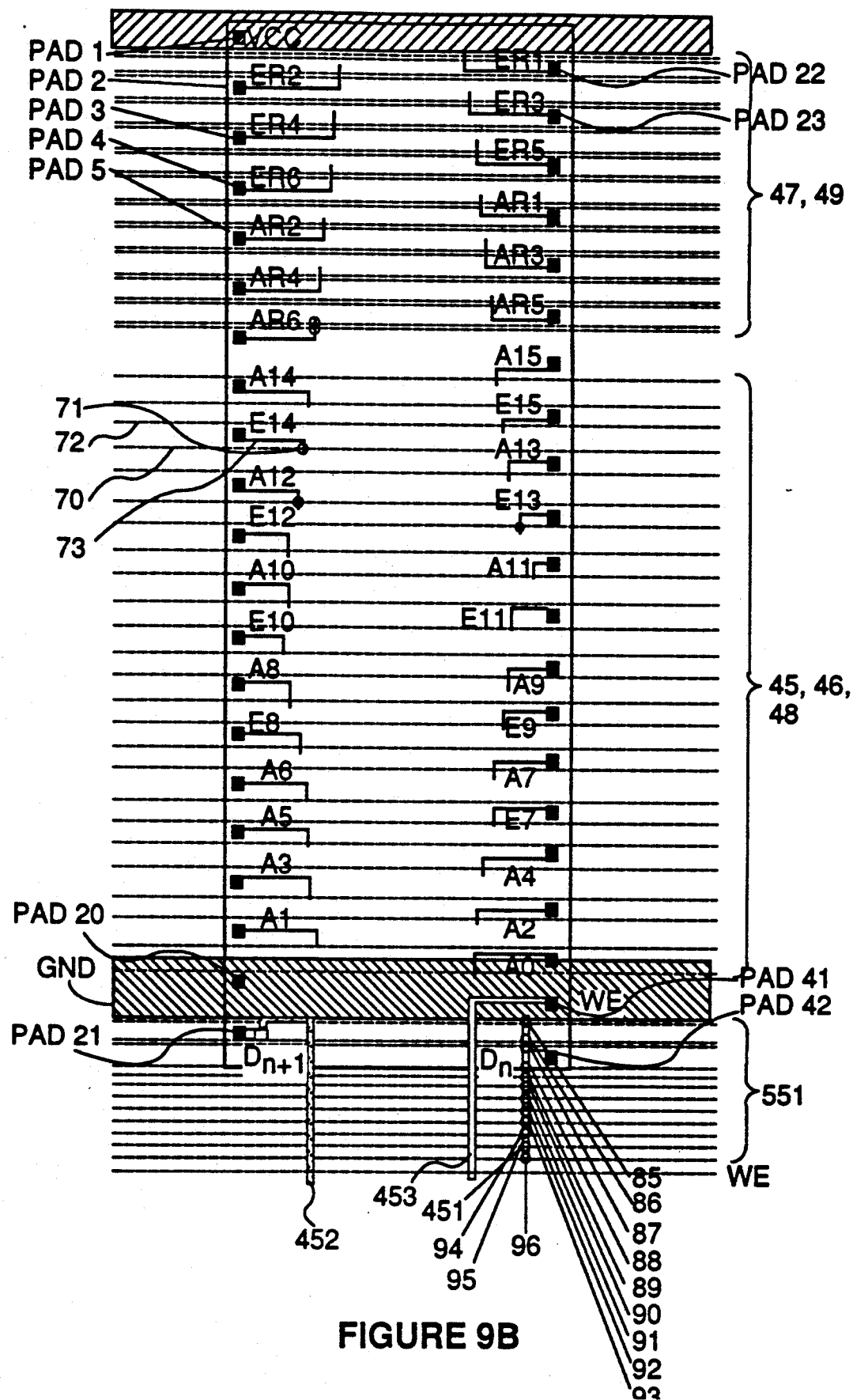

In the manufacture-before-test embodiment, the bus lines in the third layer of metal are physically arranged as shown by dotted lines 49 in FIG. 9B. Because of the large space between bus lines, test pads can be located in metal 3 between these bus lines. For example, test pad E14 of FIG. 9B is located in metal 3 between bus line 50 and bus line 52. A via not shown is beneath metal 3 test pad E14, allowing metal 3 test pad E14 to contact metal 2 line 53. If the block is found acceptable upon testing, via 51 is opened, allowing bus line 50 to contact metal 2 line 53, which is connected to points within the block. Vias connecting other test pads and bus lines are similarly provided and opened if the block is found acceptable. Via openings and connections can be made by laser drilling or programming of antifuses at the via locations. Alternatively, vias may be opened by laser or E-beam welding, which causes melting of the insulation layers between metal 2 and metal 3 so that a permanent connection is formed between the two layers at this location. Testing at metal 2 avoids the need for antifuses or E-beam welding but requires the manufacturing process be interrupted for testing. Testing after metal 3 is formed and patterned avoids the interruption for testing but requires a more complex process for discretionary via formation. Antifuses are not desirable in DRAM structures due to their associated resistance.

*Method Of Testing:* Each block in the wafer is tested to determine that every cell in that block functions properly and that the logic in that block properly addresses, reads, and writes to every cell. A 64K bit block in which each bit is tested using small number of test pads, functions as follows.

Since 64K is $2^{16}$, 16 test pads are needed for applying the 16 address bits to the 2nd metal address lines of the block. In an embodiment in which each bit can be separately addressed, one data line per block receives output from a single cell at a time, requiring a 17th test pad. In another embodiment in which two bits of a word accessed by a single address are stored in the block, two data lines are provided for reading and writing data to bits in taht block. Other organizations can of course be provided in which different numbers of bits are accessed by a single address, and the corresponding number of data lines provided for each commonly addressed bit in the block.

Herein is discussed the embodiment in which two data lines per block are commonly addressed, the second data line being acessed through an 18th test pad. A write enable buffer is controlled from a 19th test pad. If there are 40 to 64 banks of blocks, then it will take 6 more test pads to enable the block and to determine that the block is properly enabled. These six bank-enable test pads lead to a six input AND gate in the block (in one embodiment it is well known that NAND, NOR, and OR gates can alternatively perform this function), raising the test pad count to 25.

According to a DRAM embodiment in which a separate addressing port is available for refreshing the DRAM, 6 more bank address lines, and 9 more row address lines require another 15 test pads. In the preferred embodiment all columns are refreshed simultaneously, so no column refresh lines are provided and non need to be tested. Two additional power pads are required to supply Vcc and GND to the block being tested.

*Forming Connection Between The Address And Data Buses In Metal 3 And The Blocks Below:* According to the present invention, the entire response to the results of testing for defects as well as flexibility in organizing the memory on the wafer can be accomplished by forming vias in the insultaion via level beneath the metal bus structure. As discussed above, this via level may be formed either before or after testing. If testing is performed before the via level is formed, the insulation of the via level is formed, and then vias are opened in a pattern responsive to testing Above each block are potential via opening sites. For example, as shown in FIG. 9A, a row of vertically aligned opening sites (55-through-66) is located above data line DO (45) of FIG. 9A where each of the horizontally extending data bus segments will pass over data line DO (45). If the block is found acceptable upon testing, an opening will be made in one of these opening sites so that when the final metal layer is laid down, it will extend into the opening and contact data line DO. When the final metal is patterned and the data bus horizontal portions are formed, the via will electrically connect data line 45 of the block to this selected horizontal data bus line.

A bi-directional data line buffer will also have been connected to the horizontal data bus line at one of its ports and to one of 288 vertical data bus lines at the other of its ports, this vertical data bus line also having been connected through another via somewhere along its length to a horizontal line in the second metal layer in the center channel to a particular enter channel pad which sends and receives data for that bit of a word.

As shown in FIG. 9A, there are vertically extending address lines in metal 2 extending from the row and column decode test pads of the block for a length sufficient to extend under a corresponding metal 3 bus line that will pass horizontally over the block. This is represented in FIG. 9A by lines 50 and 51. Each of the cell address lines in a good block may be connected to its corresponding cell address line in the address bus of metal 3. For every good block, each of the bank address lines in metal 2 is connected to a true or complement but not both of the true and complement band address lines of metal 3, thereby determining the bank address of that block. The blocks in each bank are connected to a different combination of true and complement lines to assign a unique address to the bank. The word position of the data bits in one block is determined by which lines in the data bus they are connected to.

The selection of the memory organization is thus controlled by the set of openings formed in this single last via layer which connects the good blocks to appropriate combinations of bank address and data lines at the intersections of the metal 2 and metal 3 corresponding lines.

The flexibility in organization of the memory (word length, number of banks) is achieved by providing enough data lines in the data bus to handle the maximum desired word length, and enough bank address lines to be able to address the maximum desired number of banks. In the examples discussed above, 6 bank address lines (and 6 complements) are provided so that up to 64 banks may be provided, and 288 data bus lines are provided so that a word 288 bits long may be read or written in response to an address. It is possible to greatly increase the flexibility for determining the organization after testing simply by adding more data lines to the data bus or adding more bank address lines to the address bus.

Figure 10A:
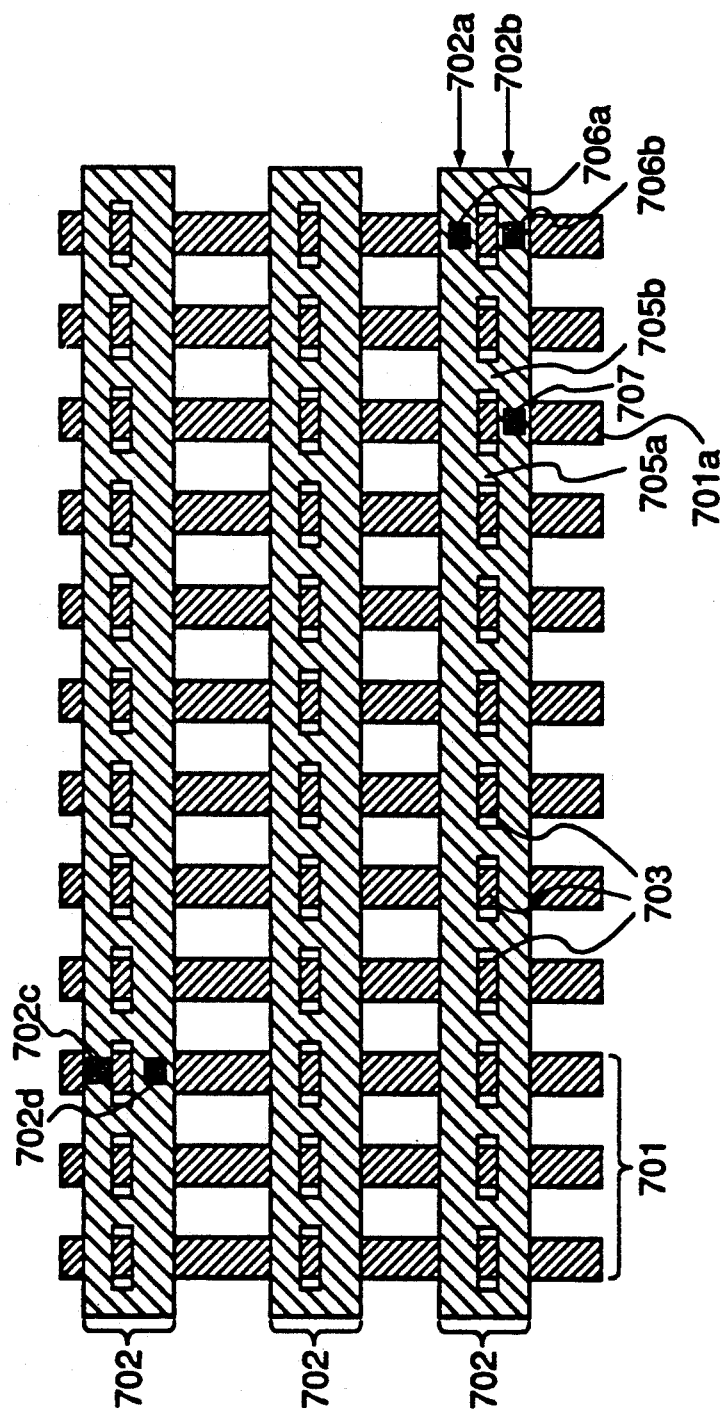
FIG. 10A shows a detailed image of three single lines in a metal 3 horizontal bus structure having redundant connection sites.
Figure 10B:
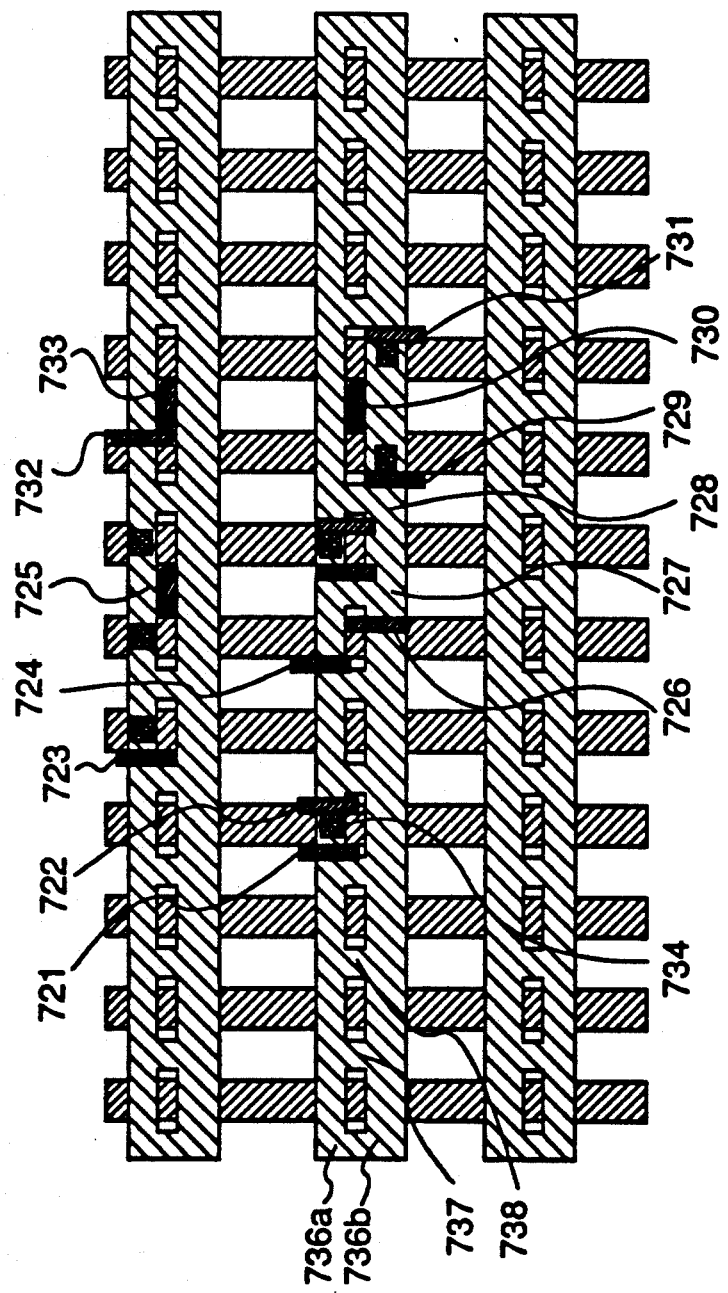
FIG. 10B shows the repair possibilities available with the redundant line structure of FIG. 10A.

*Bus Line Structure With Redundant Contact Points:*
FIG. 10A and FIG. 10B show an enlarged image of three single lines in the third metal horizontal bus structure. This same image preferably applies to lines in all three of the data, address, and refresh buses. This structure provides redundancy for correcting defects in the bus structure which may occur or be detected after the testing of blocks and logic, and after the bus structure has been interconnected to the blocks and logic.

The line width of the bus line is sufficient that two different contact points to vertically extending lines in metal 2 are available and located side-by-side. FIG. 10A shows a section of the structure in metal 2 and metal 3 above one of the memory blocks. Lines 702, of which three are shown, extend horizontally in metal 3 and are separated from vertically extending lines 701 in metal 2 by the insulation layer in which vias will be, or have been, formed. Each of lines 702 is wide enough to allow two points of contact to each of the lines 701, for example at locations 706a and 706b. Between each pair of potential points of contact, each line 702 may be broken during patterning to leave spaces, such as 703, thereby dividing each of lines 702 into an upper portion 702a and a lower portion 702b. These upper and lower portions of each line 702 remain interconnected at interconnection regions such as 705a and 705b.

FIG. 10B illustrates the repair possibilities available with the redundant metal bus structure of FIG. 10A. Lines 721 through 733 represent laser cuts which have been made in bus lines 702 to sever adjacent portions of the bus lines, thus isolating faults, while maintaining a continuous metal signal line. If a defect, for example an opening 707 (see FIG. 10A) occurs in one of lines 702 such that line 702 segment 702b could not be connected to line 701a, a second interconnection site is available. If defect 707 is a short between point 702b and line 701a, and interconnection at this point is not desired, the bus structure can be repaired by isolating the defect, as shown in FIG. 10B. As an example, assume that via location 734 (FIG. 10B) has an undesired short to the underlying metal 2 line. This short can be eliminated by cutting metal 3 bus line 736a at locations 721 and 722, which isolates via location 734 while maintaining a continuous metal signal line along metal 3 bus section 736b through metal bridges 727, 728, and others. In similar fashion, an unwanted defect in metal 3 (for example, a short to metal 1) can be isolated by cutting at points 729, 730, and 731. Making cuts at both locations 724 and 726 will separate bus line 736 into two isolated sections. It is possible, of course to use laser cutting to separate shorts in metal 2 between adjacent lines after testing of blocks. This method works best with the embodiment in which testing is performed before the application of the personalized via layer.

*Flexibility: Random And Clustered Defects Easily Accommodated in Embodiment Using Few Data Lines Above Rows:* According to the present invention, any arrangement of defects, and consequently bad memory blocks, can be avoided by properly connecting the bus structure to good blocks only. Since address and data buses extend above all blocks in the wafer, all blocks are located so that they can be readily connected to both bus structures. However, it is not necessary that all lines of the data bus extend over all blocks of the wafer. That main data bus, having 288 lines in the present embodiment, extends vertically in the center channel. For every word in the memory, each bit must be connected to a corresponding bit line in the data bus. By arranging blocks of a bank such that blocks in which bits of many different banks are placed in a single row, for example bits 0 through 7, it is only necessary to run 8 data lines over that row. Running 12 data lines over a row allows for a block in that row to store any of 12 different bits of a word. The preferred embodiment incorporates buffers between the vertically extending main portion of the data bus and the horizontally extending data lines which run above the memory blocks. The buffers are not connected until after testing. They are connected such that the horizontal bit lines for reading/writing bit 0 extend over a sufficient number of acceptable blocks necessary to store bit 0 of each word in the memory. Likewise with all bits of a word.

If testing indicates that a large portion of one row is defective, no particular bit of a word is affected since the blocks for particular significant bits of sequential banks are simply sequentially assigned to good blocks, skipping defective blocks. Horizontal data bus lines extending above the row of block pairs are then assigned and connected through buffers to the corresponding line of the data bus, thereby interconnecting the data terminals of blocks which will store bits accessed by that vertical data bus line. For example, in an 80 megabyte RAM (720 megabit RAM) having 40 banks, there will be a 40 blocks in which bit zero must be accessed Likewise there will be 40 blocks in which the 288 line Nth bit will be stored into one or a few rows. This means that only a few horizontal extensions of the vertical data bus are needed to access all of the Nth bits.

Redundancy is such that wafers having any number of good memory blocks can be used. Those wafers having a smaller number of good blocks are simply interconnected to address a smaller amount of memory. Any good memory block can be connected as a member of any bank and for any bit position in that bank. This provides complete flexibility for the avoidance of defects.

Figure 11:
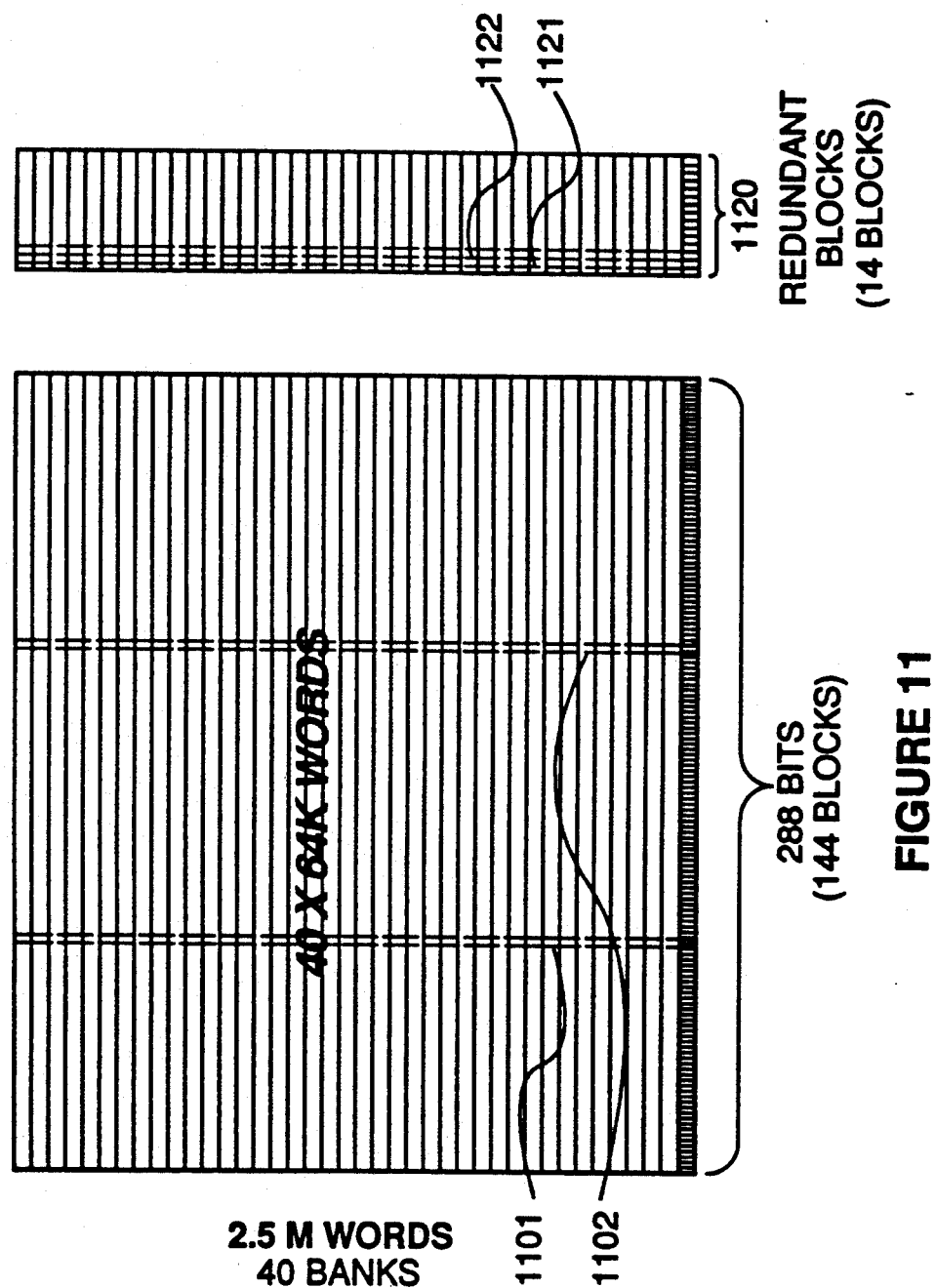

*Method of Compensating For Blocks That Fail At Burn-In:* After all metallization interconnect has been completed there must exist the ability to compensate for any in functioning blocks that may occur during final burn-in. Burn-in is an accelerated stress test performed at elevated temperatures while the device is electrically exercised. Burn-in is typically but not necessarily performed before shipment to customers. As shown in FIG. 11, one embodiment of the present invention compensates for burn-in failure by providing a set of redundant blocks 1120, on the order of 10 percent of the minimum total block count An additional 10 percent is added to each bank, for example 14 blocks per bank in the example using 144 blocks per bank, to make the total number of blocks per bank equal to 158. (10 percent is a worse-case, 1 to 2 percent being more probable based on common failure rates reported in the literature). The redundant blocks 1120 are grouped in a manner similar to the primary blocks 41, and the addresses to the banks and blocks remains as previously described. Input and output from the redundant blocks 1120 are fed to an additional 28 I/0 pads in center channel 101, such as pads 102-102d (FIG. 8A). Signals to and from the additional I/0 pads are routed off the wafer through an additional 28 lines in exterior interconnect 103 (see FIG. 3). All I/0 lines are then routed to an area external to the wafer where selective connection or disconnection can be accommodated using wire bonds or soldered wire jumpers. If any part of the circuitry contacted by an I/0 line leading to one of blocks 41 shows faulty performance, due either to being connected to one or more faulty blocks 41, or due to faults within the lines and vias themselves, the I/O) line may be left unused. As long as the number of lines leading to circuitry having defects is no more than 28, there are sufficient lines to good blocks to meet the specified memory capacity. Such connection/disconnection of defective lines can also be accomplished using integrated circuits, as is well known. Instead of being connected to one of the center channel pads, the extra 28 I/0 lines can be brought to a separate, small auxiliary connector located inboard to the edge of the package which is used only for responding to the final burn-in test.

*Use Not Limited to Memory Array:* Even though the preferred embodiment discussed above is a large memory, the invention is not limited to memory circuitry. The invention also applies to logic devices where there are multiple repeating identical blocks that can be enabled by a binary addressing scheme. One such device is an array processor which may contain a complex matrix of identical small microprocessors.

Other embodiments of the invention will become obvious to those skilled in the art in light of the above description of the invention. Such other embodiments are intended to fall withinthe scope of the present invention.

We claim:

1. A method for forming an integrated circuit structure comprising the steps of:
    forming and patterning a plurality of layers of semiconductive, conductive, and insulating material to comprise blocks of logic elements electrically isolated from each other and segments of control logic electrically isolated from each other and from said blocks of logic elements;
    testing said blocks of logic elements and said segments of control logic for proper operation;
    forming upon said plurality of layers a discretionary via layer;
    forming upon said discretionary via layer a bus conductive layer and patterning said bus conductive layer to form a bus structure extending above said blocks of logic elements and said segments of control logic; and
    opening vias in said discretionary via layer to selectively connect said blocks of logic elements and said segments of control logic to said bus structure.

2. A method for forming an integrated circuit structure as in claim 1 in which:
    said step of forming and patterning a plurality of layers of semiconductive, conductive, and insulating material further comprises forming test pads electrically isolated from each other for tesing said blocks of logic elements and said segments of control logic;
    said steps of forming and patterning said bus conductive layer further comprises forming bonding pads electrically isolated from each other and from said blocks of logic elements and said segments of control logic, for contacting devices external to said integrated circuit structure;
    and said step of opening vias further includes opening vias to selectively connect said segments of control logic to said bonding pads.

3. A method for forming an integrated circuit structure as in claim 1 in which said step of opening vias in said discretionary via layer to selectively connect said blocks and said segments to said bus structure comprises opening vias to connect one of a pair of true and complement address bus lines which carry true and complement of an address bit to each of said blocks, thereby establishing an address for each of said blocks, and thereby selecting an organization of said integrated circuit structure.

4. A method for forming an integrated circuit structure as in claim 1 in which said step of opening vias in said discretionary via layer to selectively connect said blocks and said segments to said bus structure comprises opening vias to connect only blocks and segments which have been found in said step of testing to operate properly.

5. A method for forming an integraged circuit structure as in claim 1 in which said step of opening vias in said discretionary via layer to selectively connect said blocks and said segments to said bus structure is performed before said bus conductive layer is formed.

6. A method for forming an integrated circuit structure as in claim 5 in which said step of opening vias in said discretionary via layer to selectively connect said blocks and said segments to said bus structure comprises heating said via layer where vias are to be opened using and E-beam.

7. A method for forming an integrated circuit structure as in claim 5 in which said step of opening vias in said discretionary via layer to selectively connect said blocks and said segments to said bus structure comprises heating said via layer where vias are to be opened using a laser.

8. A method for forming an integrated circuit structure as in claim 5 in which said step of opening vias in said discretionary via layer to selectively connect said blocks and said segments to said bus structure comprises using a mask to identify where vias are to be opened.

9. A method for forming an integrated circuit structure as in claim 1 in which said step of opening vias in said discretionary via layer to selectively connect said blocks and said segments to said bus structure is performed after said bus conductive layer is formed.

10. A method for forming an integrated circuit structure as in claim 9 in which said step of opening vias in said discretionary via layer to selectively connect said blocks and said segments to said bus structure comprises hearing said via layer where vias are to be located using an E-beam.

11. A method for forming an integrated circuit strucutre as in claim 9 in which said step of opening vias in said discretionary via layer to selectively connect said blocks and said segments to said bus structure comprises heating said via layer where vias are to be located using a laser.

* * * * *

UNITED STATES PATENT AND TRADEMARK OFFICE
CERTIFICATE OF CORRECTION

PATENT NO. : 5,252,507
DATED : October 12, 1993
INVENTOR(S) : James W. Hively, et al It is certified that error appears in the above-indentified patent and that said Letters Patent is hereby corrected as shown below:

Col. 2, line 55, after "cells", insert --.--.

Col. 4, line 56, delete "member" and substitute --number--.

Col. 6, line 29, after "needed", insert --.--.

line 68, after "testing" insert --.--.

Col. 7, line 13, delete "vias are opened" and insert --connections are made--.

line 39, after "critical", insert --.--.

Col. 8, line 57, delete "megwords" and substitute --megawords--.

line 62, after "invention", insert --.--.

Col. 9, line 63, after "825.", insert --In accordance with accepted industry usage, the terms "true" and "complement" refer to a binary value and its opposite, respectively.--

Col. 11, line 29, after "simultaneously", insert --.--.

Col. 12, line 53, delete "20" and substitute --2-95--.

Col. 13, line 44, after "operation", insert --.--.

line 59, after "refreshed", insert --.--.

lines 61 and 63, delete "808" and substitute --812--.

UNITED STATES PATENT AND TRADEMARK OFFICE
CERTIFICATE OF CORRECTION

PATENT NO. : 5,252,507
DATED : October 12, 1993
INVENTOR(S) : James W. Hively et al It is certified that error appears in the above-indentified patent and that said Letters Patent is hereby corrected as shown below:

Col. 14, line 65, after "101", insert --.--.

Col. 15, line 21, after "function", insert --.--
        line 66, after "assigned", insert --.--.

Col. 16, line 8, after "wafer", insert --.--
        line 36, after "bad", insert --.--.
        line 53, after "wafer", insert --.--.

Col. 20, line 13, delete "date" and substitute --data--.
        line 32, delete "ine" and substitute --line--
        line 36, delete "se9ments" and substitute --segments--.
        line 37, delete "testin9" and insert --testing--.

Col. 22, line 11, after "102" insert --.--.
        line 18, delete "5A" and substitute --5C--.
        line 59, delete "511" and substitute --571--.
        line 63, after "includes" insert --9--.

Col. 23, line 32, after "2" insert --.--.

Col. 24, line 18, delete "polycrysalline" and substitute --polycrystalline--.

UNITED STATES PATENT AND TRADEMARK OFFICE
CERTIFICATE OF CORRECTION

PATENT NO. : 5,252,507

DATED : October 12, 1993

INVENTOR(S) : James W. Hively, et al

Page 3 of 5

It is certified that error appears in the above-indentified patent and that said Letters Patent is hereby corrected as shown below:

Col. 24, line 38, after "blocks" insert --lines 1016 and 1017 are extended lines for connecting address and data buffers to the bus running over them, using vias appropriately placed.--

Col. 26, line 54, delete "49" and insert --of buses 45, 46, 47, 48 and 49--.

line 55, delete "50" and substitute --70--.

line 56, delete "51" and substitute --71--.

Col. 27, line 22, delete "dotted lines 49" and substitute --49 dotted lines--.

line 25, delete "50" and substitute --70--.

line 26, delete "52" and substitute --72-- line 28, delete "53" and substitute 73--.

line 29, delete "51" and substitute --71- line 30, delete "53" and substitute --73--

Col. 28, lines 29 and 30, delete "55-through-66" and substitute --85-through-96-- line 30, delete "DO(45)" and substitute --551--.

line 32, delete "DO(45)" and substitute --452--.

UNITED STATES PATENT AND TRADEMARK OFFICE
CERTIFICATE OF CORRECTION

PATENT NO. : 5,252,507
DATED : October 12, 1993
INVENTOR(S) : James W. Hively, et al It is certified that error appears in the above-indentified patent and that said Letters Patent is hereby corrected as shown below:

Col. 28, line 36, after "contact" insert --one of the--.

line 36, delete "lineDO" and substitute --lines 551--.

line 38, after "connect" insert --a--.

line 38, delete "45 of" and insert --to-- line 39, delete the entire line beginning with "to this" and ending "bus line"

line 53, delete "50 and 51" and substitute --70 and 71--.

UNITED STATES PATENT AND TRADEMARK OFFICE
CERTIFICATE OF CORRECTION

PATENT NO. : 5,252,507

DATED : October 12, 1993

INVENTOR(S) : James H. Hively et al

It is certified that error appears in the above-indentified patent and that said Letters Patent is hereby corrected as shown below:

Col. 30, line 42, delete "a".
line 67, after "count" insert --.--.
Col. 31, line 17, delete "blocks 41" and substitute --the primary blocks--.
line 19, delete "41".

Signed and Sealed this

Twenty-sixth Day of July, 1994

Attest:

BRUCE LEHMAN

Attesting Officer

Commissioner of Patents and Trademarks